United States Patent
Kudo

(10) Patent No.: US 8,519,687 B2
(45) Date of Patent: Aug. 27, 2013

(54) SEMICONDUCTOR DEVICE AND POWER SOURCE DEVICE WITH A CURRENT DETECTION CIRCUIT

(75) Inventor: Ryotaro Kudo, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 374 days.

(21) Appl. No.: 12/911,098

(22) Filed: Oct. 25, 2010

(65) Prior Publication Data

US 2011/0121804 A1   May 26, 2011

(30) Foreign Application Priority Data

Nov. 20, 2009   (JP) .................................. 2009-264801

(51) Int. Cl.
  *G05F 1/00* (2006.01)
(52) U.S. Cl.
  USPC .......................................... 323/282; 323/283
(58) Field of Classification Search
  USPC ......................................... 323/259, 282, 283
  See application file for complete search history.

(56) References Cited

U.S. PATENT DOCUMENTS

| 7,696,738 B2 * | 4/2010 | Kasai et al. | 323/285 |
| 7,936,158 B2 * | 5/2011 | Noda | 323/282 |
| 2006/0164057 A1 | 7/2006 | Kudo et al. | |
| 2009/0072805 A1 * | 3/2009 | Yamada | 323/283 |
| 2009/0091308 A1 * | 4/2009 | Omi | 323/282 |
| 2009/0201000 A1 * | 8/2009 | Kojima et al. | 323/282 |
| 2009/0237049 A1 | 9/2009 | Hachiya et al. | |
| 2009/0302820 A1 * | 12/2009 | Shimizu et al. | 323/285 |

FOREIGN PATENT DOCUMENTS

| JP | 2006-211760 A | 8/2006 |
| JP | 2008-17620 A | 1/2008 |
| JP | 2008-136307 A | 6/2008 |

* cited by examiner

*Primary Examiner* — Adolf Berhane
*Assistant Examiner* — Emily Pham
(74) *Attorney, Agent, or Firm* — Mattingly & Malur, PC

(57) ABSTRACT

A power source device capable of improving the power conversion efficiency at a light load independent of an input power source voltage is realized. For example, a clock signal is output from a common control unit to a PWM-mounted drive unit including a reverse-current detection circuit in addition to a peak current control method. This clock signal is selected by a mode setting signal from either of a clock signal with a constant frequency or a clock signal which is generated via a one-shot pulse generation circuit every time an output voltage at an output power source node decreases. When the latter is selected, the switching frequency at a light load decreases and the power conversion efficiency improves. Furthermore, the peak current control method can reduce the input power source voltage dependence of the switching frequency.

10 Claims, 19 Drawing Sheets

(a)

(b)

| SMOD | OVPm | SMOV |
|---|---|---|
| L | L | L |
| H | L | Hi-Z |
| x | H | H | x : don't care

FIG. 15
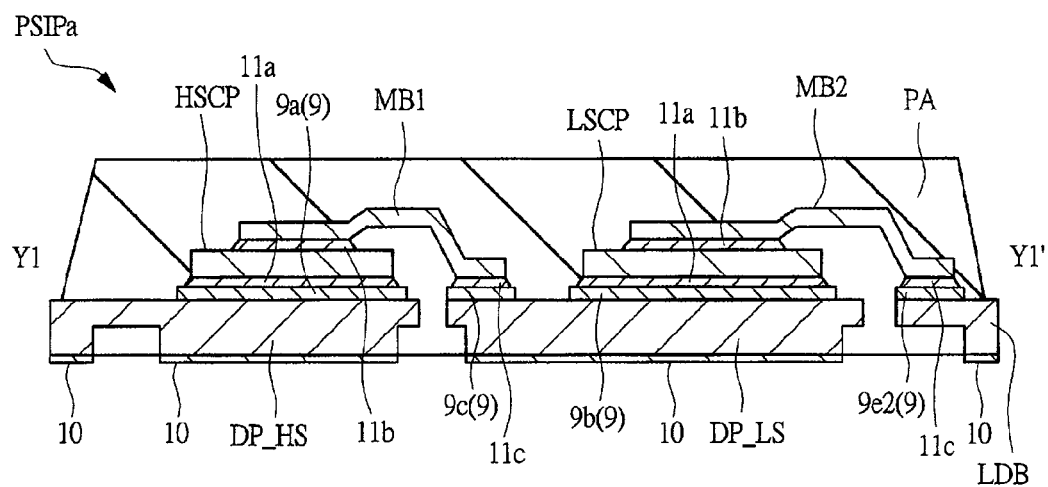
(a)
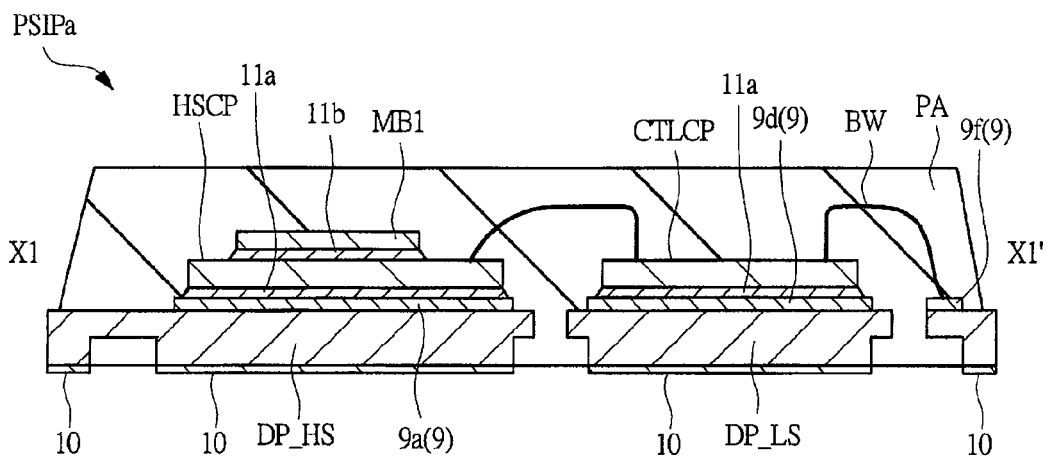
(b)

FIG. 19
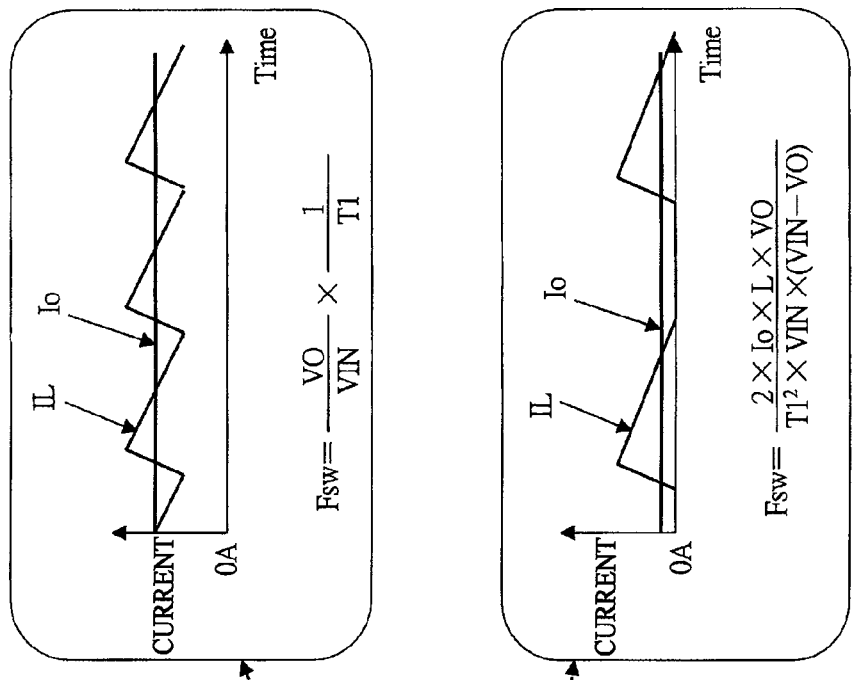
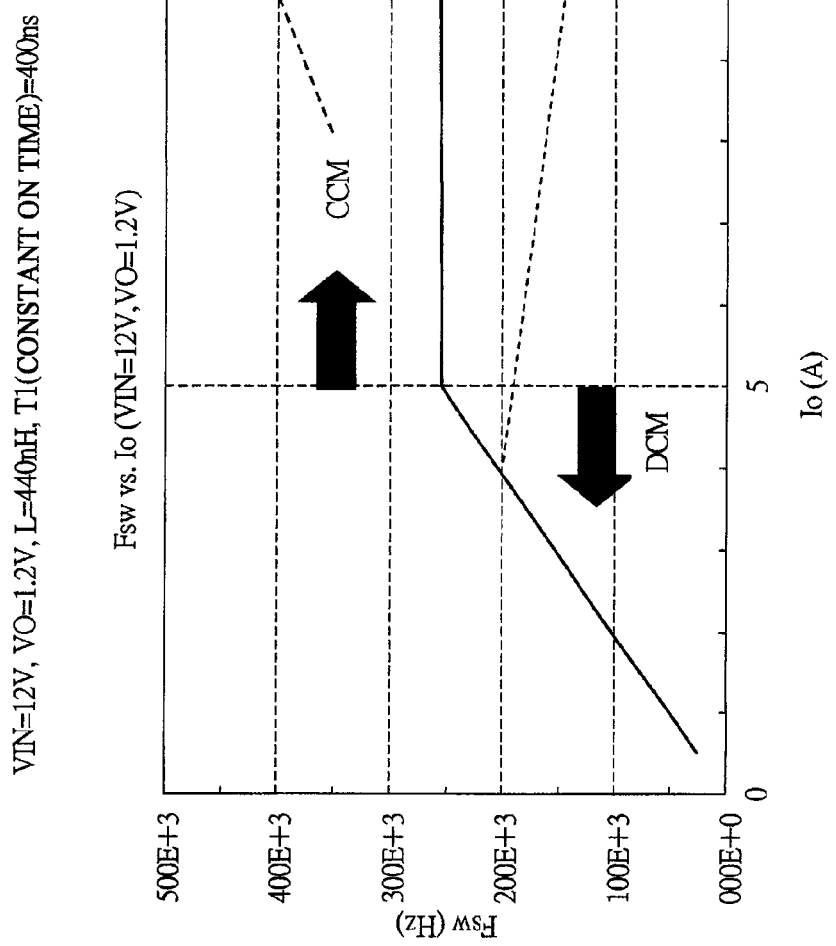
Fsw vs. Io (VIN=12V, VO=1.2V)
VIN=12V, VO=1.2V, L=440nH, T1(CONSTANT ON TIME)=400ns

SEMICONDUCTOR DEVICE AND POWER SOURCE DEVICE WITH A CURRENT DETECTION CIRCUIT

CROSS-REFERENCE TO RELATED APPLICATION

The disclosure of Japanese Patent Application No. 2009-264801 filed on Nov. 20, 2009 including the specification, drawings and abstract is incorporated herein by reference in its entirety.

BACKGROUND OF THE INVENTION

The present invention relates to a semiconductor device and a power source device using the same, and, for example, relates to a technique effectively applied to a switching power source device converting a high voltage to a low voltage.

For example, Japanese Patent Laid-Open No. 2008-17620 (Patent Document 1) describes a semiconductor device wherein a power MOSFET, a drive circuit driving the same, and a control circuit transmitting a switching control signal to the drive circuit are mounted in one package (FIG. 1, FIG. 2).

Japanese Patent Laid-Open No. 2008-136307 (Patent Document 2) shows a DC-DC converter based on a comparator method of controlling an output voltage by adjusting a switching frequency. Japanese Patent Laid-Open No. 2006-211760 (Patent Document 3) shows a synchronous rectification type switching regulator capable of detecting a reverse flow flowing through an inductor at a light load.

SUMMARY OF THE INVENTION

In various electronic devices and electric devices represented by, for example, a personal computer (hereinafter, PC) and the like, an AC/DC converter (e.g., ATX power supply) generating a desired DC voltage (e.g., 12 V, 5 V, 3.3 V) from an AC voltage (e.g., 100 V) serving as a commercial power source is used. In a notebook PC, a DC voltage with a specific value is supplied by a battery. In various semiconductor components used in a PC or the like, a stable power source voltage is required, and depending on circumstances, a plurality of power source voltage values is required. For this reason, a voltage generated by this AC/DC converter or a battery is converted to a predetermined voltage (e.g., 1.0 V) and a stable voltage by a step-down non-insulated DC/DC converter (buck converter) and the converted voltages are supplied to various semiconductor components.

Such a buck converter is usually referred to as a POL (point of load) converter or the like. In the case of a PC, for example, the buck converter is mounted in the vicinity of various circuit units (CPU: Central Processing Unit, and a GPU: Graphics Processing Unit, a memory, and the like) on a PCB (Printed Circuit Board), such as a mother board or various extension boards (graphic board and the like).

In recent years, in various semiconductor components as described above, a high current is needed as the speed of the semiconductor components has increased. On the other hand, for example, a power saving design is also being made, wherein when a certain internal circuit block becomes unnecessary in accordance with its own workload, a power supply to this internal circuit block is temporally cut off. In particular, in various semiconductor components in an electronic device operating with a battery, such a power saving design becomes extremely important. Therefore, a support for a wide range of current and an improvement in the power conversion efficiency are required also for the buck converter.

FIG. 17 is a block diagram showing an example of the configuration of a power source device studied as a prerequisite to the present invention. FIG. 18 is a waveform chart showing an example of the operation of the power source device of FIG. 17. This power source device is an example of the configuration reflecting a "constant ON time" (COT) control method. The power source device shown in FIG. 17 comprises a high side transistor QH, a low side transistor QL, and a PWM control unit PWMCTLU to turn on/off these transistors. PWMCTLU includes a comparator circuit CMP50, a one-shot pulse generation circuit 1PLSb, a reverse-current detection circuit RIDETb, a control logic circuit LGC, and a drive circuit DRV. One ends of QH and QL are commonly coupled to the output node of a switch signal SW, and one end of an inductor L is coupled to this node. The other end of the inductor L serves as an output power source node VO, and is coupled to a power supply terminal of a load LOD and a capacitor Cld and is also fed back to PWMCTLU.

Such a power source device operates as follows at a light load (when the current consumption (load current) Io of the load LOD is small). That is, as shown in FIG. 18, first, the comparator circuit CMP50 detects that the voltage of the output power source node VO decreased to a predetermined comparison voltage VC (e.g., 1.0 V), and in response to this, the one-shot pulse generation circuit 1PLSb generates a one shot pulse with a predetermined pulse width (constant ON time) T1. In this T1, the gate voltage of the transistor QH becomes an 'H' level to turn on QH, and the gate voltage of the transistor QL becomes an 'L' level to turn off QL, and accordingly the current IL of the inductor L increases. On the other hand, after T1, QH is turned off and QL is turned on, respectively, and the current IL continues to flow through QL while gradually decreasing.

Here, if the current IL decreases to 0 A, a current path is formed in the direction from the capacitor Cld toward QL through the inductor L (that is, a reverse flow occurs). This reverse flow is detected by a reverse-current detection circuit RIDETb, and in response to this, QL is turned off, and as a result, both QH and QL are turned off. In a period (T3) in which both QH and QL are turned off, the load LOD is driven by the capacitor Cld and the voltage of the output power source node VO gradually decreases. Then, when the voltage VO decreases to the comparison voltage VC of the comparator circuit CMP50, QH is turned on again and the same operation will be repeated.

FIG. 19 is a view showing the load current dependence of the switching frequency in the power source device of FIG. 17. FIG. 20 is a graph showing the load current dependence of the power conversion efficiency in the power source device of FIG. 17. As shown in FIG. 19, at a heavy load (when the load current Io is 5 A or more in the example of FIG. 19), the power source device of FIG. 17 operates in a continuous conduction mode (CCM) while at a light load (when Io is less than 5 A in the example of FIG. 19), the power source device operates in a discontinuous conduction mode (DCM). CCM is an operation mode in which the current IL flowing through the inductor L is kept always larger than 0 A, and DCM is an operation mode in which IL becomes 0 A in a certain period. Regardless of CCM or DCM, the rising gradient (=(VIN−VO)/L) and falling gradient (=−VO/L) of the current IL flowing through the inductor L and the rise time (i.e., constant ON time T1) of IL are fixed values, respectively, and the average value of IL becomes Io. Accordingly, for example, when Io becomes smaller than a predetermined value, a period inevitably occurs in which IL becomes 0 A, and the operation mode will automatically change from CCM to DCM.

In CCM, a reverse flow will not occur to the current IL, and the switching frequency becomes a fixed value regardless of the magnitude of the load current Io. That is, when Io is in a steady state, the gradient of IL and the constant ON time T1 are fixed values as described above and additionally the maximum value and minimum value of IL become fixed values, respectively, and therefore, a switching frequency Fsw keeps a fixed value, and both the maximum value and minimum value of the current IL will shift by a predetermined amount according to an increase or decrease in Io. Fsw in this case is expressed by Formula (1) with the use of the input power source voltage VIN supplied to QH, the voltage of the output power source node VO, and the constant ON time T1.

$$Fsw=VO/(VIN \times T1) \quad (1)$$

On the other hand, in DCM, because a reverse flow may occur to the current IL, as described in FIG. 18, a period T3 occurs, in which IL is set to 0 A as this reverse flow is detected. In this DCM, because the minimum value of IL is fixed to 0 A unlike in CCM, the switching frequency Fsw will change depending on the magnitude of the load current Io. In addition, since the rising gradient varies as the input power source voltage VIN varies, Fsw also has the dependence on VIN. In this case, Fsw is expressed by Formula (2).

$$Fsw=2 \times Io \times L \times VO/\{T1^2 \times VIN \times (VIN-VO)\} \quad (2)$$

As apparent from Formula (2) and the description of FIG. 18, the smaller the load current Io, the further the switching frequency Fsw in DCM decreases (the period T3 in FIG. 18 extends as Io decreases). Thus, as shown in FIG. 20, the power conversion efficiency in DCM improves as compared with the case where the switching frequency in CCM is maintained as it is supposedly without using DCM (namely, this corresponds to the case where the reverse-current detection circuit RIDETb is not present in FIG. 17). For example, at the load current Io of approximately 2 A, when the switching frequency Fsw in CCM is maintained, the power conversion efficiency is approximately 85% while in DCM the power conversion efficiency is approximately 90%. This is because a decrease in Fsw reduces the drive loss and switching loss of QH, QL.

Thus, the use of the power source device as shown in FIG. 17 makes it possible to improve the power conversion efficiency at a light load. However, in this power source device, as apparent from Formula (2), if the input power source voltage VIN fluctuates, the switching frequency Fsw will significantly fluctuate. This characteristic, particularly in a battery-operated electronic device represented by a notebook PC or the like, is fatal because the efficiency decreases as the battery voltage decreases. In order to improve this characteristic, a method of providing an external pin for monitoring the input power source voltage may be contemplated, for example. However, in this case, an increase in the number of external pins and components (e.g., a resistor for detecting the input power source voltage) occurs, which is an inhibition factor for a reduction in the size or a reduction in cost of the power source device.

Furthermore, other problems include an improvement in the power conversion efficiency described above as well as a support for a wide range of current. As yet another problem, in the example of the configuration as shown in FIG. 17, a situation is a concern, in which in the constant ON time T1, even if the node of the switch signal SW has been short-circuited to a ground power source voltage GND, QH continues to be turned on and is destroyed or damaged.

The present invention has been made in view of the above circumstances and provides a power source device capable of improving the power conversion efficiency at a light load independently of the input power source voltage. In addition, the other purposes and the new feature of the present invention will become clear from the description of the present specification and the accompanying drawings.

The following explains briefly the outline of a typical invention among the inventions disclosed in the present application.

A power source device according to this embodiment comprises a first transistor coupled between a power source voltage and one end of an inductor, a second transistor coupled between a ground power source voltage and the one end of the inductor, a current detection circuit, an error amplifier circuit, a pulse generation circuit, a reverse-current detection circuit, and a switching control circuit. The current detection circuit generates a current detection signal reflecting a current flowing through the inductor. The error amplifier circuit amplifies the output voltage of an output power source node serving as the other end of the inductor with reference to a first setting voltage, and outputs the resultant error amplifier signal. The pulse generation circuit outputs a pulse signal every time the output voltage of the output power source node decreases to a predetermined voltage. Upon detection of a current flowing in a direction from the output power source node to the second transistor through the inductor, the reverse-current detection circuit activates a reverse current detection signal. In response to the pulse signal from the pulse generation circuit, the switching control circuit turns on the first transistor and turns off the second transistor, and when the voltage level of the current detection signal reaches the voltage level of the error amplifier signal, the switching control circuit turns off the first transistor and turns on the second transistor, and when the reverse current detection signal is activated, the switching control circuit turns off the second transistor.

Because the use of such a configuration increases the generation cycle of the pulse signal from the pulse generation circuit at a light load, the switching loss decreases and the power conversion efficiency can be improved. Furthermore, because a current mode control method is employed, even if the power source voltage fluctuates, the inductor can have approximately the same energy in approximately the same period, and the fluctuation in the switching frequency corresponding to the power source voltage can be suppressed.

To explain briefly the effect acquired by the embodiment of the typical invention among the inventions disclosed in the present application, a power source device capable of improving the power conversion efficiency at a light load independently of the input power source voltage can be realized.

BRIEF DESCRIPTION OF THE DRAWINGS

FIG. 15A is a cross sectional view showing an example of the structure along Y1-Y1' in FIG. 14;

FIG. 15B is a cross sectional view showing an example of the structure along X1-X1' in FIG. 14;

FIG. 19 is a view showing the load current dependence of the switching frequency in the power source device of FIG. 17.

DETAILED DESCRIPTION OF THE PREFERRED EMBODIMENTS

The following embodiments will be explained, divided into plural sections or embodiments, if necessary for convenience. Except for the case where it shows clearly in particular, they are not mutually unrelated and one has relationships such as a modification, details, and supplementary explanation of some or entire of another. In the following embodiments, when referring to the number of elements, etc. (including the number, a numeric value, an amount, a range, etc.), they may be not restricted to the specific number but may be greater or smaller than the specific number, except for the case where they are clearly instructed in particular and where they are clearly restricted to a specific number theoretically.

Furthermore, in the following embodiments, it is needless to say that an element (including an element step etc.) is not necessarily indispensable, except for the case where it is clearly instructed in particular and where it is considered to be clearly indispensable from a theoretical point of view, etc. Similarly, in the following embodiments, when shapes, positional relations, or the like, of components or the like are referred to, unless stated explicitly or except when they can be thought otherwise in principle, those substantially approximate or similar to the shapes or the like are also included. This statement also applies to the numeric value and range described above.

Moreover, the circuit elements constituting each functional block of the embodiments are not limited in particular, but are formed over a semiconductor substrate of single crystal silicon or the like using a known integrated circuit technique for a CMOS (complementary MOS transistor) or the like. Note that, when an MOSFET (Metal Oxide Semiconductor Field Effect Transistor) (or abbreviated as an MOS transistor) is referred to in the embodiments, a non-oxide film is not excluded as the gate insulating film.

Hereinafter, the embodiments of the present invention will be described in detail in accordance with the accompanying drawings. In all the drawings for explaining embodiments, the same symbol is attached to the same member, as a principle, and the repeated explanation thereof is omitted.

(Embodiment 1)

<<Overall Configuration of a Power Source Device>>

Figure 1:
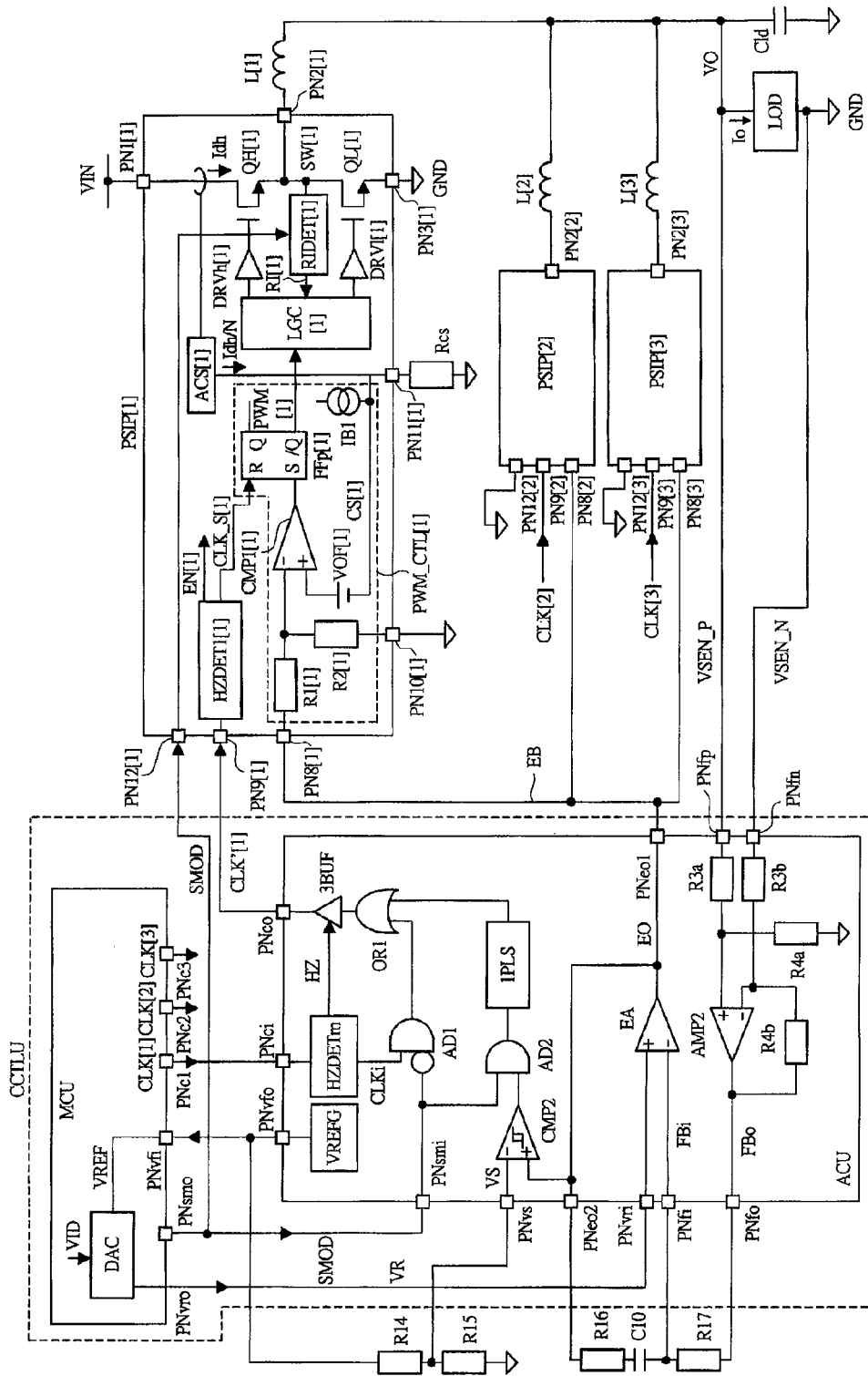
FIG. 1 is a circuit block diagram showing an example of the configuration of a power source device according to Embodiment 1 of the present invention.

FIG. 1 is a circuit block diagram showing an example of the configuration of a power source device according to Embodiment 1 of the present invention. The power source device shown in FIG. 1 comprises a common control unit CCTLU, a plurality of (here, three) PWM-mounted drive units PSIP[1]-PSIP[3] (semiconductor devices), and a plurality of (here, three) inductors L[1]-L[3]. CCTLU includes a microcontroller unit MCU and an analog companion unit ACU. One ends of L[1]-L[3] are commonly coupled to an output power source node VO, and the other ends of L[1]-L[3] are coupled to PSIP [1]-PSIP [3], respectively. Between VO and the ground power source voltage GND, a load LOD and a capacitor Cld are coupled in parallel. LOD corresponds to the above-described various circuit units (e.g., CPU, GPU, memory, etc.), which perform a predetermined operation using this VO as the power supply.

PSIP[1]-PSIP[3] are realized with a separate semiconductor package respectively, for example. MCU and ACU may be realized with a separate semiconductor package respectively, or can be realized with one semiconductor package. In realizing with one semiconductor package, MCU and ACU may be formed from a separate semiconductor chip respectively, and then be mounted in one semiconductor package using the so-called SiP (System in Package) technique, or these may be formed from one semiconductor chip and packaged. These semiconductor packages are mounted in the vicinity of the load LOD over a wiring substrate (PCB), such as a mother board or various extension boards (graphics board etc.).

The microcontroller unit MCU includes a plurality of (here, three) external terminals PNc1-PNc3 and three external terminals PNvfi, PNvro, and PNsmo. From PNsmo, a mode setting signal SMOD is output. From PNc1-PNc3, clock signals CLK[1]-CLK[3] having the same frequency and mutually different phases are output. Moreover, MCU includes a digital to analog conversion circuit DAC. In DAC, a reference voltage VREF from the external terminal PNvfi and a multiple-bit digital code (referred to as a VID code) are input, and an output voltage setting signal VR corresponding to the VID code is output from the external terminal PNvro. VR is an analog voltage signal indicative of a setting voltage for the output power source node VO. Although not limited in particular, with the VID code, VR can be selected in several tens of mV steps etc. in a voltage range, such as 0.8V to 1.8V.

The analog companion unit ACU includes 12 external terminals PNvfo, PNci, PNco, PNeo1, PNfp, PNfn, PNfo, PNfi, PNvri, PNeo2, PNvs, and PNsmi. ACU includes a reference voltage generation circuit VREFG, a high-impedance detection circuit HZDETm, a tristate buffer circuit 3BUF, an OR circuit OR1, AND circuits AD1, AD2, a one-shot pulse generation circuit 1PLS, a comparator circuit CMP2, an error amplifier circuit EA, an amplifier circuit AMP2, and resistors R3a, R3b, R4a, and R4b. VREFG generates the reference voltage VREF. This VREF is input to the external terminal PNvfi of ACU described above via the external terminal PNvfo.

The amplifier circuit AMP2 and the resistors R3a, R3b, R4a, and R4b constitute a differential amplifier circuit, wherein when the both resistance values of R3a, R3b are set to R3 and the both resistance values of R4a, R4b are set to R4, the gain of the differential amplifier circuit can be set as R4/R3. Although not limited in particular, here, R3 and R4 are set as R3=R4=11 kO to set the gain of the differential amplifier circuit to one. In this differential amplifier circuit, an output voltage detection signal VSEN_P serving as the power source voltage of the load LOD (voltage of VO) is input to the (+) side via the external terminal PNfp, and an output voltage detection signal VSEN_N serving as the ground power source voltage GND of LOD is input to the (−) side via the external terminal PNfn.

The output of AMP2 is output from the external terminal PNfo as a feedback signal FBo. PNfo is coupled to the external terminal PNfi via a resistor R17 provided outside. Moreover, PNfi is coupled to an external terminal PNeo2 via a capacitor C10 and a resistor R16 provided outside. Accordingly, FBo is smoothed by a loop compensation circuit (low pass filter) comprising R17 and C10, and this smoothed signal is input from PNfi as a feedback signal FBi.

In the error amplifier circuit EA, the feedback signal FBi described above is input to the (−) side, and the setting voltage VR from MCU described above is input to the (+) side via the external terminal PNvri. EA outputs an error amplifier signal EO via the external terminals PNeo1, PNeo2. This EO is smoothed by the loop compensation circuit (low pass filter) comprising the resistor R16 and capacitor C10 described above. Moreover, EO output from PNeo1 is transmitted on an error bus EB.

In the comparator circuit CMP2, the error amplifier signal EO is input to the (+) side, and a setting voltage VS is input to the (−) side via the external terminal PNvs. VS is generated by dividing the reference voltage VREF output from the external terminal PNvfo described above using the resistors R14, R15 provided outside. Although the detail will be described later, in the operation at a light load, the ON pulse width and switching frequency of the switching are defined based on the setting voltage VS. In the AND circuit AD2, the output of CMP2 is input to one of two inputs, and the mode setting signal SMOD from MCU described above is input to the other input via the external terminal PNsmi. The one-shot pulse generation circuit 1PLS outputs an 'H' pulse signal with a predetermined pulse width in response to a rising edge at the output node of AD2.

In the high-impedance detection circuit HZDETm, although an example of the detailed configuration is described later, the clock signal CLK[1] from MCU described above is input via the external terminal PNci, and when CLK[1] is in a high impedance state, the high-impedance detection circuit HZDETm outputs a high-impedance detection signal HZ. Moreover, when CLK[1] is not in a high impedance state, HZDETm outputs an internal clock signal CLKi which is the regenerated CLK[1]. In the AND circuit AD1, CLKi is input to one of two inputs and an inversion signal of the mode setting signal SMOD described above is input to the other input via the external terminal PNsmi.

In the OR circuit OR1, the output of the AND circuit AD1 is input to one of two inputs, and the output of the one-shot pulse generation circuit 1PLS is input to the other input. In the tristate buffer circuit 3BUF, the output of OR1 is input and a clock signal CLK'[1] is output from the external terminal PNco in response to the control based on HZ. 3BUF sets CLK'[1] to a high impedance state when HZ is in an active state, and sets CLK'[1] to the output of OR1 when HZ is in an inactive state.

The PWM-mounted drive unit PSIP[1] includes eight external terminals PN1[1]-PN3[1], and PN8[1]-PN12[1]. The input power source voltage VIN (e.g., 12V etc.) is supplied to PN1[1], and the ground power source voltage GND is supplied to PN3[1]. The error amplifier signal EO from ACU is input to PN8[1] via the error bus EB, and the clock signal CLK'[1] from MCU is input to PN9[1]. To PN2[1], the switch signal SW[1] is output and also the other end of the inductor L[1] described above is coupled, while GND is supplied to PN10[1].

PSIP[1] further includes transistors (power transistors) QH[1], QL[1], drive circuits DRVh[1], DRVl[1], a control logic circuit LGC[1], a PWM control circuit PWM_CTL[1], an active-current detection circuit ACS[1], a reverse-current detection circuit RIDET[1], and a high-impedance detection circuit HZDET1[1]. Here, an N channel MOSFET (power MOSFET) is used for the transistors QH[1], QL[1]. In the transistor QH[1], the drain thereof is coupled to the input power source voltage VIN, the gate is coupled to DRVh[1], and the source is coupled to the external terminal PN2[1] serving as the output terminal of the switch signal SW[1]. In the transistor QL[1], the drain thereof is coupled to PN2[1] (SW[1]), the gate is coupled to DRVl[1], and the source is coupled to GND via the external terminal PN3[1].

In response to the clock signal CLK'[1] from the external terminal PN9[1], the high-impedance detection circuit HZDET1[1] generates an enable signal EN[1] depending on the state of CLK'[1] and also generates an internal clock signal CLK_S[1]. Although an example of the detailed configuration is described later, HZDET1[1] outputs EN[1] when CLK'[1] is in a high impedance state, and outputs CLK_S[1], which is the regenerated signal of CLK'[1], when CLK'[1] is not in a high impedance state. The active-current detection circuit ACS[1] detects a current Idh flowing through the transistor QH[1], and generates a current equal to 1/N (e.g., N=18500 etc.) of the current Idh. This current is converted to a voltage by a resistor Rcs externally connected to the external terminal PN11[1], and this voltage serves as a current detection signal CS[1].

The PWM control circuit PWM_CTL[1] includes a comparator circuit CMP1[1], resistors R1[1], R2[1], an offset voltage source (offset voltage) VOF[1], a bias current source IB1, and a set/reset type flip-flop circuit FFp[1]. R1[1] and R2[1] are coupled in series between the external terminals PN8[1] and PN10[1], and divide the error amplifier signal EO input from PN8[1]. Although not limited in particular, R1[1]

and R2[1] are set to the same resistance value (e.g., 50 kO etc.) here, and accordingly EO is divided into ½.

The bias current source IB1 (e.g., 490 pA etc.) is used for stabilizing the current detection signal CS[1] described above, and outputs a current to the external terminal PN11[1] together with the active-current detection circuit ACS[1]. In the comparator circuit CMP1[1], the error amplifier signal EO divided by the resistors R1[1], R2[1] described above is input to the (−) side, and the current detection signal CS[1] added with an offset voltage (e.g., 0.1V etc.) generated by the offset voltage source VOF[1] is input to the (+) side. In the flip-flop circuit FFp[1], the internal clock signal CLK_S[1] from HZDET1[1] is input to a reset input node (R), the output signal from CMP1[1] is input to a set input node (S), and the PWM signal PWM[1] is output from an inverted output node (/Q).

The reverse-current detection circuit RIDET[1] receives the mode setting signal SMOD from MCU described above via the external terminal PN12[1], and operates under the control of this SMOD. When SMOD is in an active state, upon detection of a current in the reverse direction from the external terminal PN2[1] toward PN3[1], RIDET[1] activates a reverse current detection signal RI[1], while when SMOD is in an inactive state, RIDET[1] maintains RI[1] in an inactive state. The control logic circuit LGC[1] controls the switching states of QH[1], QL[1] via DRVh[1], DRVl[1] based on the PWM signal PWM[1] from the PWM control circuit PWM_CTL[1]. Moreover, in response to the active state of RI[1], LGC[1] turns off QL[1] via DRVl[1].

The PWM-mounted drive units PSIP[2], PSIP[3] have the same internal circuit configuration as that of PSIP[1] described above except that the input signal and output signal from/to the outside slightly differ. Therefore, hereinafter, the external terminal, internal circuit, and internal signal of each PSIP[n] are distinguished by [n] (n=1, 2, 3). In PSIP[2], the clock signal CLK[2] from MCU is input via the external terminal PN9[2], and the error amplifier signal EO from ACU is input via the error bus EB and external terminal PN8[2]. PSIP[2] outputs the switch signal SW[2] via the external terminal PN2[2]. The inductor L[2] is coupled to the PN2[2].

Similarly, in PSIP[3], the clock signal CLK[3] from MCU is input via the external terminal PN9[3], and the error amplifier signal EO from ACU is input via the error bus EB and external terminal PN8[3]. PSIP[3] outputs the switch signal SW[3] via the external terminal PN2[3]. The inductor L[3] is coupled to the PN2[3]. Note that, in PSIP[2], PSIP[3], the external terminals PN12[2], PN12[3] corresponding to the external terminal PN12[1] of PSIP[1] are fixed to a voltage level (here, the ground power source voltage GND) corresponding to the inactive state of the mode setting signal SMOD.

<<Overall Operation of the Power Source Device>>

FIG. 2A is a waveform chart showing an example of a three-phase operation when the mode setting signal MOD is set to an 'L' level in the power source device of FIG. 1. FIG. 2B is a waveform chart showing an example of a two-phase operation when the mode setting signal MOD is set to the 'L' level in the power source device of FIG. 1. FIG. 2C is a waveform chart showing an example of a one-phase operation when the mode setting signal MOD is set to the 'L' level in the power source device of FIG. 1. First, the three-phase operation shown in FIG. 2A is used when the load is high (e.g., load current Io>33 A etc.). In this case, the microcontroller unit MCU sets the mode setting signal SMOD to an inactive state ('L' level), and outputs CLK[1] with the phase 0°, CLK[2] with the phase 120°, and CLK[3} with the phase 240°. In response to CLK[1}, the analog companion unit ACU outputs CLK'[1] similar to CLK[1] via HZDETm, AD1, OR1, and 3BUF because SMOD is in the 'L' level. PSIP[1], PSIP[2], and PSIP[3] operate in response to CLK'[1], CLK[2], and CLK[3], respectively.

To briefly describe the operation with PSIP[1] taken as an example, first, in response to CLK'[1], HZDET[1] outputs CLK_S[1] similar to CLK'[1], and in response to the 'H' pulse of CLK_S[1], FFp[1] causes the PWM[1] to transit to the 'H' level. In response to the 'H' level of PWM[1], QH[1] is turned on, QL[1] is turned off, and an energy is stored in the inductor L[1]. Here, the current flowing through QH[1] (equivalent to the inductor current flowing through L[1]) is detected as the current detection signal CS[1] via ACS[1].

On the other hand, the output voltage of the output power source node VO is amplified (here, with the gain=1) by a differential amplifier circuit including AMP2 in ACU, and a difference between the resultant voltage and the output voltage setting signal VR (e.g., 1 V etc.) is amplified by EA. CMP1[1] in PSIP[1] compares the error amplifier signal EO from EA (more specifically, K (resistance dividing ratio) times the error amplifier signal EO) with a value of the current detection signal CS[1]+offset voltage VOF[1], and outputs the 'H' level when the peak value of CS[1]+VOF[1] reaches EO×K. FFp[1] causes PWM[1] to transit to the 'L' level in response to the 'H' level output from CMP1[1], and in response to this 'L' level, QH[1] is turned off and QL[1] is turned on. That is, a peak current control method is executed. Hereinafter, the current is returned in a path from L[1]->the load LOD and capacitor Cld->QL[1], and subsequently the same operation will be repeated in response to the 'H' pulse of CLK'[1], again. Moreover, PSIP[2] and PSIP[3] perform the same operation as PSIP[1] except that their phases differ from that of PSIP[1]. As a result, the three-phase operation is performed with the same switching frequency as that of CLK[1]-CLK[3].

Next, the two-phase operation shown in FIG. 2B is used when the load is moderate (e.g., 18 A<Io≦33 A etc.). In this case, MCU sets SMOD to the inactive state ('L' level), and outputs CLK[1] with the phase 0° and CLK[2] with the phase 180°. Furthermore, MCU sets CLK[3] to a high impedance state. In response to CLK[1], ACU outputs CLK'[1] similar to CLK[1]. In response to CLK'[1], CLK[2], PSIP[1] and PSIP[2] respectively perform the two-phase operation with the same switching frequency as that of CLK[1], CLK[2], as with the case of FIG. 2A.

On the other hand, the high-impedance detection circuit HZDET1[3] in PSIP[3] detects the high impedance state of CLK[3], and deactivates the enable signal EN[3]. In response to the deactivation of EN[3], PSIP[3] fixes both QH[3] and QL[3] to an OFF state, and also selectively stops a bias current etc. required in each internal circuit. This sets PSIP[3] to a power saving mode. Such a combination of the clock signal transmission function and the enable-signal transmission function using one CLK[3] can reduce the number of wires between MCU and each PSIP[n] (n=1, 2, 3) or the number of external terminals in MCU or PSIP[n], or the like as compared with the case where each signal is individually transmitted (i.e., the case where two signals are used).

Subsequently, the one-phase operation shown in FIG. 2C is used when the load is light (e.g., Io≦18 A etc.). In this case, MCU sets SMOD to the inactive state ('L' level), and outputs CLK[1] with the phase 0°. Furthermore, MCU sets both CLK[2] and CLK[3] to a high impedance state. In response to CLK[1], ACU outputs CLK'[1] similar to CLK[1], and in response to CLK'[1], PSIP[1] performs the one-phase operation with the same switching frequency as that of CLK[1]. On the other hand, in response to the high impedance state of CLK[2] and CLK[3], PSIP[2] and PSIP[3] fix QH[2], QL[2], QH[3], and QL[3] to an OFF state, respectively, and also transit to the power saving mode as with the case of FIG. 2B.

Figure 3:
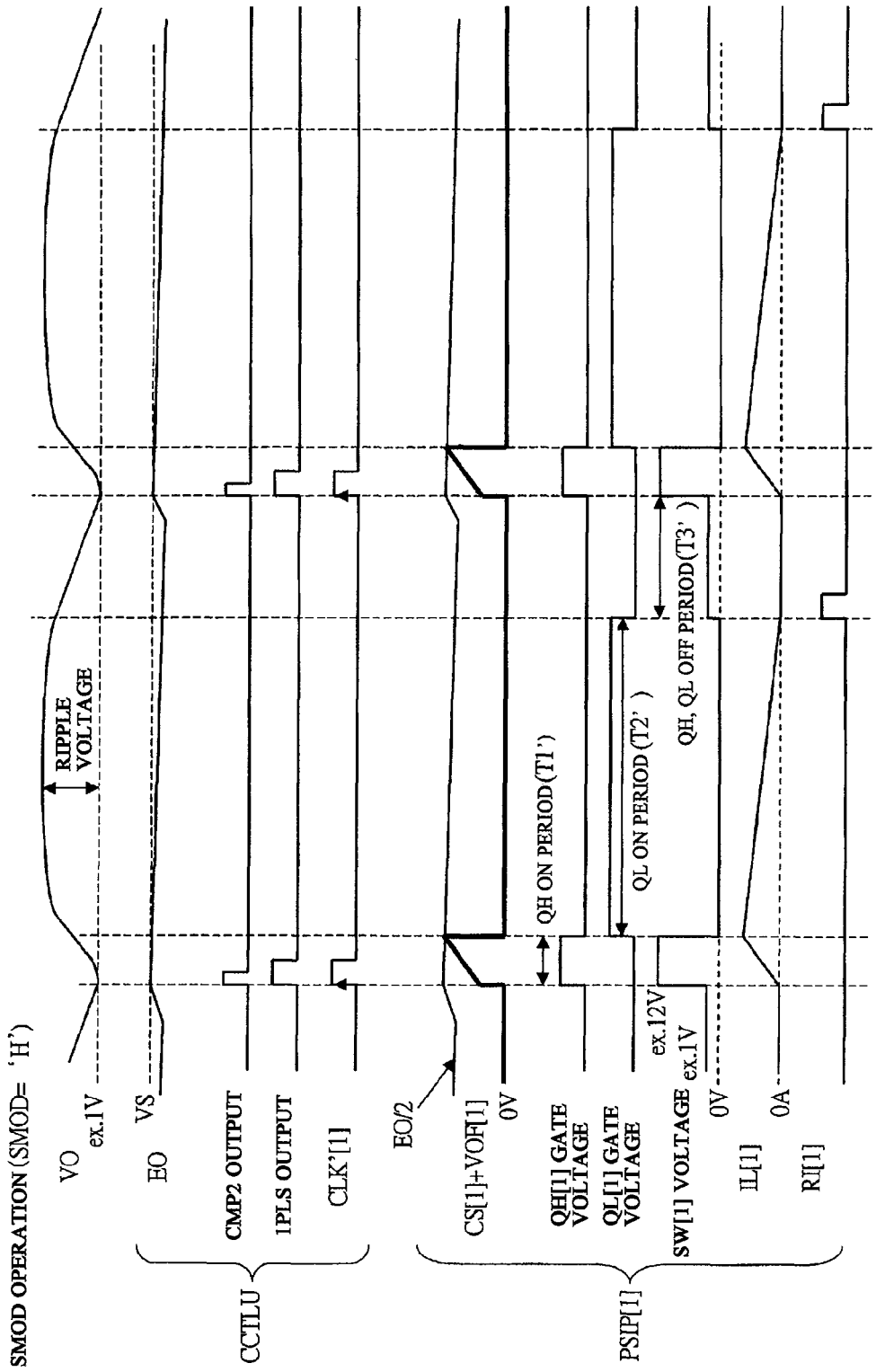
FIG. 3 is a waveform chart showing an example of the one-phase operation when the mode setting signal is set to an 'H' level in the power source device of FIG. 1.

FIG. 3 is a waveform chart showing an example of the one-phase operation when the mode setting signal SMOD is set to the 'H' level in the power source device of FIG. 1. The operation shown in FIG. 3 is used at a light load when the load is very small (e.g., Io is several amperes or less). In this case, MCU sets SMOD to the active state ('H' level), and outputs CLK[1] with the phase 0°. Furthermore, MCU sets both CLK [2] and CLK[3] to a high impedance state. In response to CLK[1∴, ACU outputs CLK'[1] via CMP2, AD2, 1PLS, OR1, and 3BUF because SMOD is in the 'H' level.

That is, in ACU, the voltage of the error amplifier signal EO increases as the voltage of the output power source node VO decreases. When the voltage of EO reaches the setting voltage VS, CMP2 will output the 'H' pulse, and in response to this 'H' pulse, 1PLS outputs the 'H' pulse with a predetermined pulse width. The 'H' pulse from this 1PLS serves as CLK'[1]. On the other hand, in PSIP[1], CLK_S[1] is generated based on the CLK'[1], and PWM[1] transits to the 'H' level via FFp[1]. As a result, QH[1] is turned on and QL[1] maintains the OFF state.

Once QH[1] is turned on, the current IL[1] flowing through the inductor L[1] as well as the current detection signal CS[1] reflecting the current IL[1] increase linearly with time, as described in FIG. 2A. Then, when the voltage of CS[1} added with VOF[1] reaches a voltage (EO/2) which is the error amplifier signal EO divided by the resistors R1[1], R2[2], FFp[1] causes the PWM[1] to transit to the 'L' level. In response to the 'L' level of the PWM[1], QH[1] is turned off and QL[1] is turned on. Note that, the voltage of the switch signal SW[1] is the VIN level (e.g., 12 V etc.) during a period T1' in which QH[1] is turned on, and is the GND level during a period. T2' in which QH[1] is turned off and QL[1] is turned on. During the period T1', the voltage of VO gradually increases and accordingly the voltage of EO will gradually decrease.

During the period TV in which QH[1] is turned off and QL[1] is turned on, the current IL[1] flowing through the inductor (return current) decreases linearly with time due to the electromotive force by the inductor L[1]. Moreover, during the period T2, the voltage of VO rises and then approaches toward a leveling-off state. Here, when the IL[1] reaches 0 A (i.e., when the energy stored in L[1] is used up), the voltage of SW[1] becomes the voltage of VO (e.g., approximately 1 V etc.) and therefore a current in the reverse direction from PN2[1] toward PN3[1] starts to flow. The reverse-current detection circuit RIDET[1], upon detection of this reverse current, sets the reverse current detection signal RI[1] to the active state ('H' level). In response to this 'H' level of RI[1], LGC[1] turns off QL[1]. This results in a period T3' in which both QH[1] and QL[1] are turned off.

During the period T3' in which both QH[1] and QL[1] are turned off, the load LOD is driven by the energy stored in the capacitor Cld, and as a result, the voltage of VO gradually decreases and accordingly the voltage of EO gradually increases. During the period T3', the voltage of SW[1] is the voltage of VO (e.g., approximately 1 V etc.). Here, when the voltage of EO reaches the setting voltage VS, CMP2 in ACU outputs the 'H' pulse again, and thereby the period T3' transits to the period T1' again, and hereafter, the period T2', the period T3', the period T1', . . . are similarly repeated. Note that, the current IL[1] flowing through the inductor L[1] is equal to the current (i.e., the current of the switch signal SW[1]) flowing to the external terminal PN2[1] serving as the output terminal, and in other words, the current IL[1] may be the output current of PSIP[1].

Figure 4:
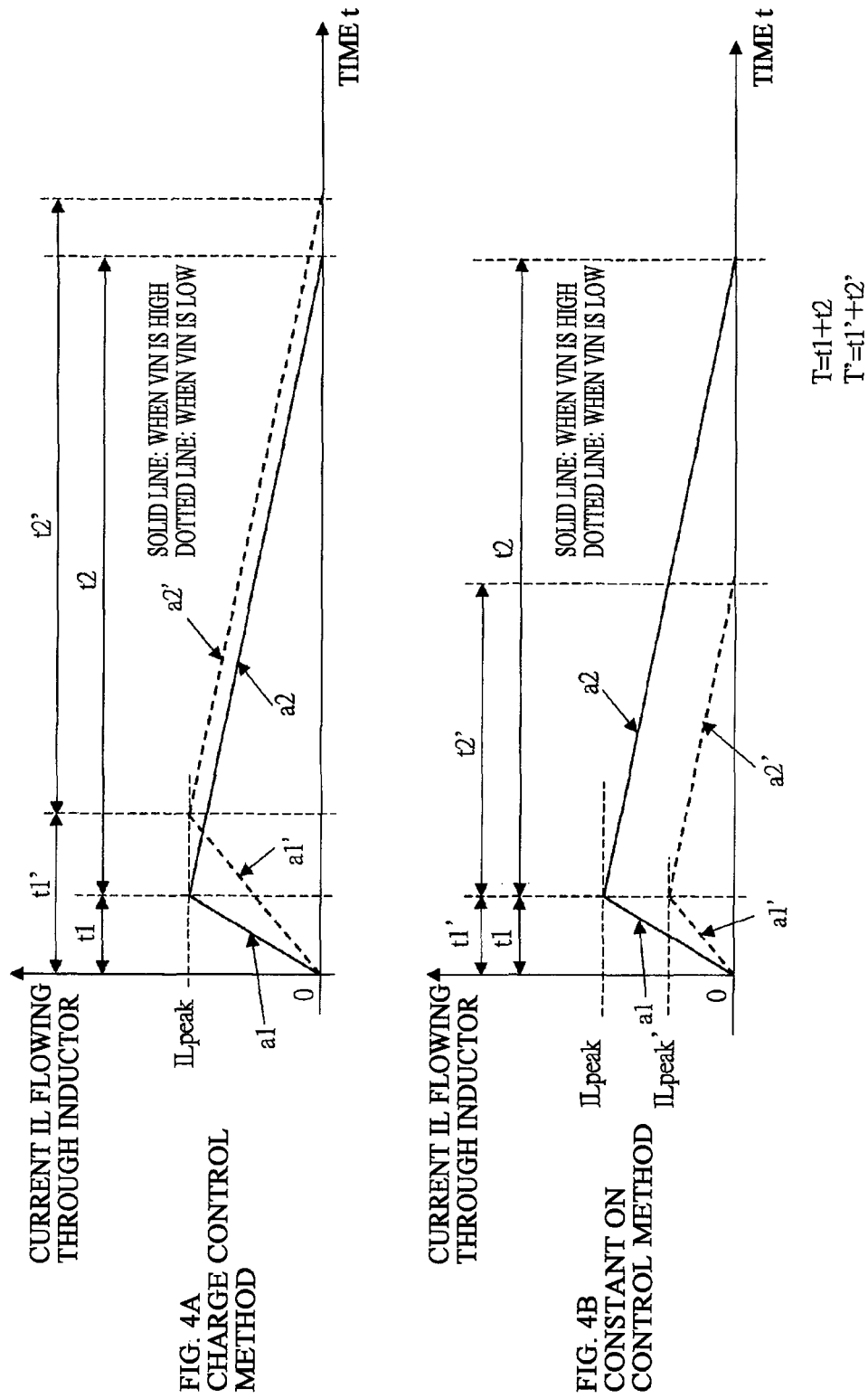
FIG. 4A is the principle view schematically showing the operation mode at a light load in FIG. 3.
FIG. 4B is the principle view schematically showing the operation mode at alight load in FIG. 18 for the comparison purpose.
Figure 18:
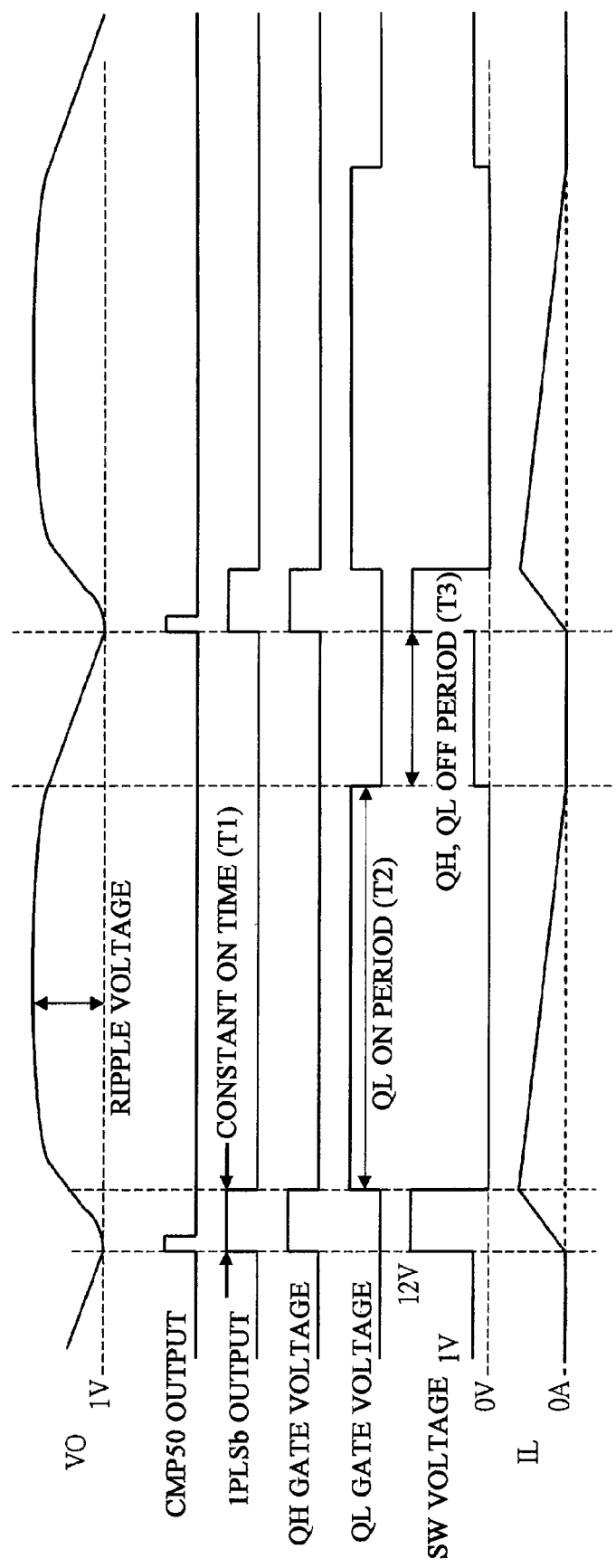
FIG. 18 is a waveform chart showing an example of the operation of the power source device of FIG. 17.
Figure 20:
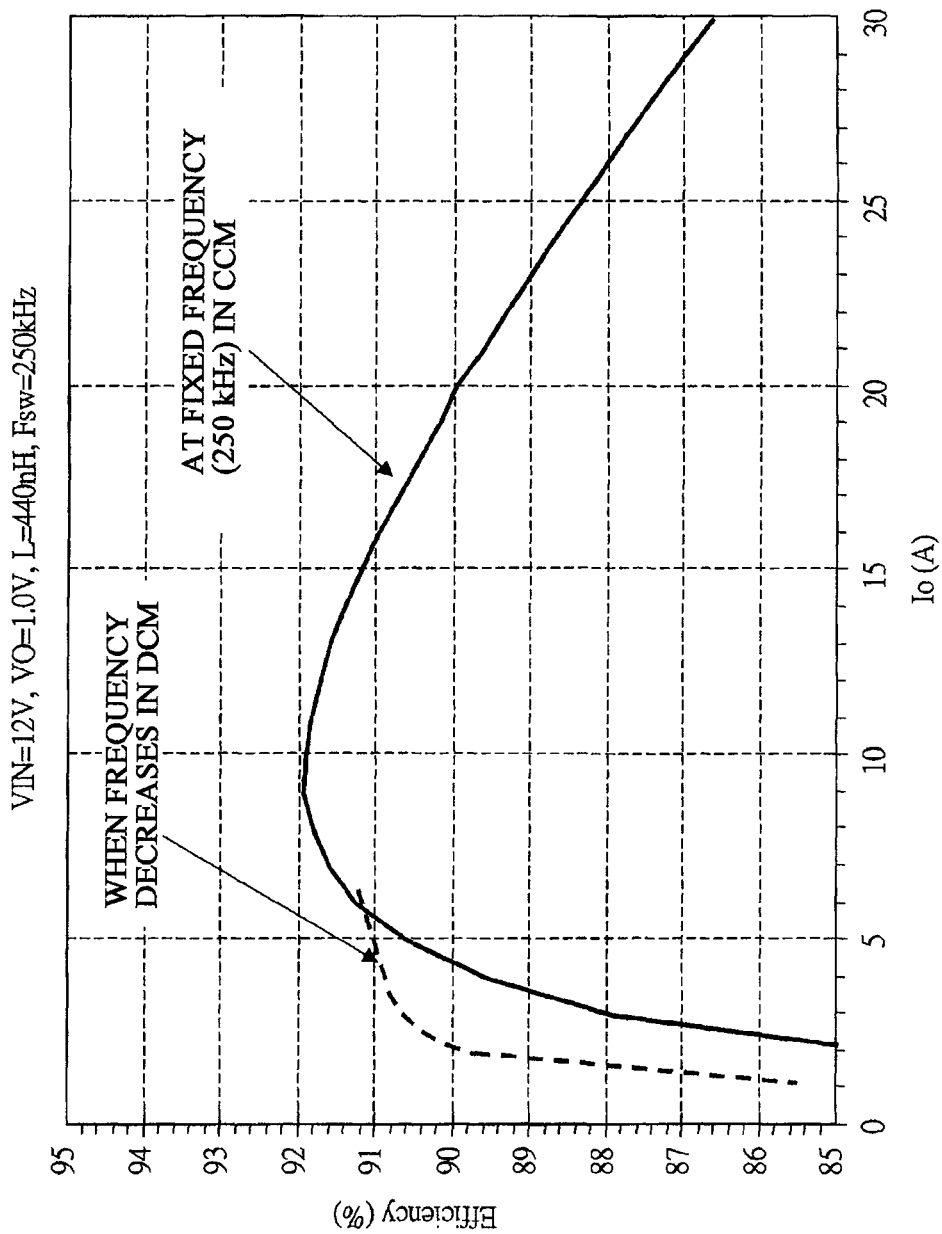
FIG. 20 is a graph showing the load current dependence of the power conversion efficiency in the power source device of FIG. 17.

FIG. 4A is the principle view schematically showing the operation mode at a light load (when the mode setting signal SMOD is in the 'H' level) in FIG. 3, and FIG. 4B is the principle view schematically showing the operation mode at a light load in FIG. 18 for the comparison purpose. In FIGS. 4A, 4B, a solid line and a dotted line represent the current IL flowing through the inductor L when VIN is high and low, respectively.

As shown in FIG. 4A, when VIN is high, during the period (the period t1) in which the transistor QH is turned on and the transistor QL is turned off, a gradient a1 of the current IL is expressed as $dIL/dt=(VIN-VO)/L$. Moreover, during the period (the period t2) in which the transistor QH is turned off and the transistor QL is turned on, a gradient a2 of the current IL is expressed as $dIL/dt=-VO/L$. Since a peak value ILpeak of the current IL can be determined by the setting voltage VS in FIG. 1, the current IL when the input power source voltage VIN decreased is the one as shown by the dotted line in FIG. 4A. That is, the setting voltage VS in FIG. 1 defines the switching frequency, as shown in FIG. 3, and also defines the voltage value of the error amplifier signal EO at a time point when the power transistor QH is turned on. Therefore, the setting voltage VS also indirectly defines the peak value ILpeak of the current IL. When the input power source voltage VIN decreases, the peak value ILpeak of IL will not change but the gradient of IL will change from a1 to a1', and accordingly the ON time of QH will change from t1 to t1'.

Here, usually, "the absolute value of a1 (or a1')>> the absolute value of a2 (or a2')" because "VIN(e.g. , 12 V etc.) >>V0 (e.g., 1 V etc.)". In other words, t1<<t2 (or t1'<<t2'). Accordingly, as apparent from FIG. 4A, if the peak value ILpeak of IL is kept constant, the cycle for the current IL to rise from 0 A and return to 0 A again is t1+t2 when VIN is high, and is t1'+t2' when it is low. Since t2=t2' here, the amount of change in the cycle of the current IL is t1'−t1. Since the value of t1'−t1 is extremely small, the amount of change in the cycle may be also extremely small. Furthermore, in one cycle of the current IL, the magnitude of the energy (corresponding to the area of each triangle drawn by the solid line and the dotted line) which the inductor has is also approximately the same between when VIN is high and when it is low. As a result, approximately the same energy can be held in approximately the same period regardless of the fluctuation in VIN, and the switching cycle (T1'+T2'+T3' of FIG. 3) (and the switching frequency) also can be set approximately constant regardless of the fluctuation in VIN. That is, the power source device of FIG. 1 includes a control method, in which the charge amount supplied to the inductor L is kept approximately constant for each switching cycle even if the input power source voltage VIN fluctuates in the operation at a light load as shown in FIG. 3.

In contrast, in FIG. 4B, when the input power source voltage VIN decreases, the current IL changes as shown by the dotted line. Because the ON time of the transistor QH is fixed (i.e. , t1=t1') in the operation of FIG. 18, the peak value of IL will decrease from ILpeak to ILpeak' in response to VIN. Then, as can be seen from FIG. 4B, because the period between the peak value and 0 A of the current IL significantly decreases from t2 to t2', the cycle of the current IL significantly decreases from t1+t2 to t1'+t2'. Moreover, the fact that the area of each triangle drawn by the solid line and the dotted line also significantly decreases reveals that the energy of the inductor L significantly decreases. Accordingly, when VIN decreases, the switching frequency significantly increases as compared with the case of FIG. 4A.

Figure 17:
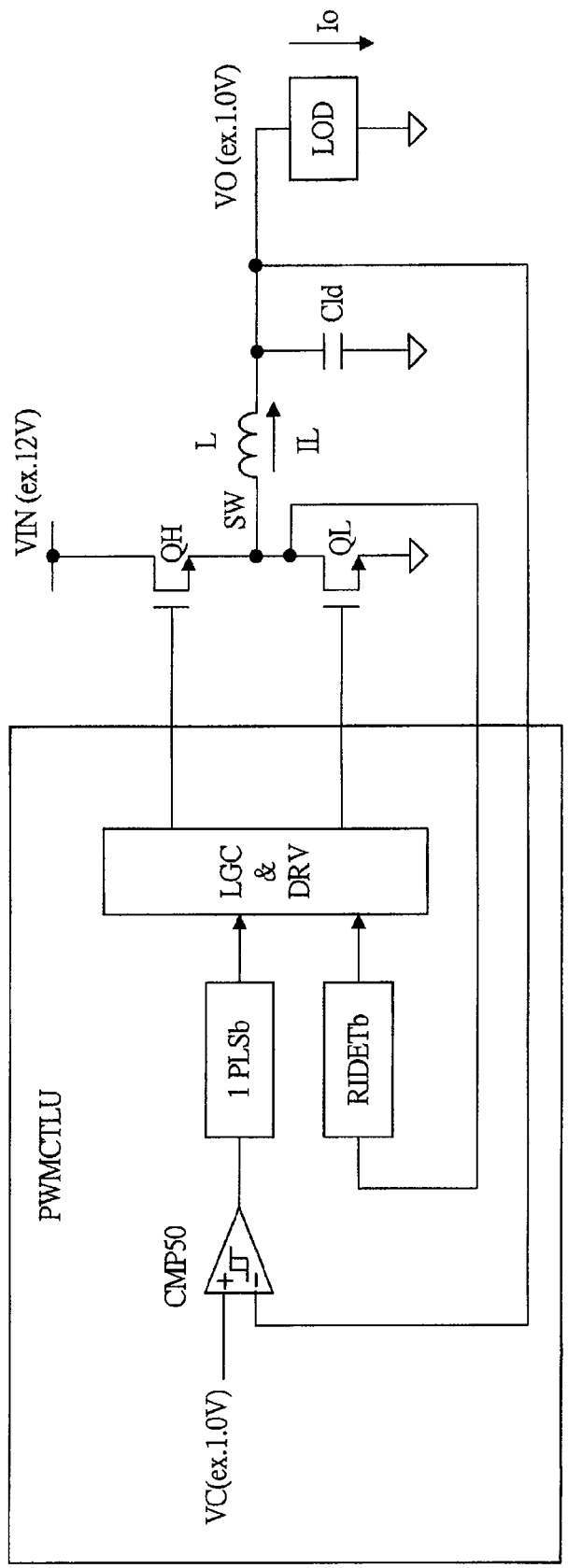
FIG. 17 is a block diagram showing an example of the configuration of a power source device studied as a prerequisite to the present invention.

Incidentally, to compare FIG. 1 with FIG. 17, not a method in which the switching frequency or the like at a light load is determined by monitoring the error amplifier signal EO using the comparator circuit CMP2, as with the example of the configuration of FIG. 1, but a method may be contemplated, in which the switching frequency or the like at a light load is determined by monitoring the voltage value of the output power source node VO using a separately provided comparator circuit, for example, as with the example of the configuration of FIG. 17. However, in this case, when QH is turned on based on the separately provided comparator circuit, the voltage level of EO determined by a path separate therefrom is not necessarily appropriate. That is, according to the offset characteristic, delay characteristic, or the like of the error amplifier circuit EA, the voltage level of EO when QH is turned on becomes higher or lower than necessary, and as a result the ON pulse width of QH might not be determined appropriately. It is thus preferable to use a method in which the switching frequency or the like at a light load is determined by monitoring EO using the comparator circuit CMP2, as with the example of the configuration of FIG. 1.

<<Overall Effect of the Power Source Device>>

Figure 5:
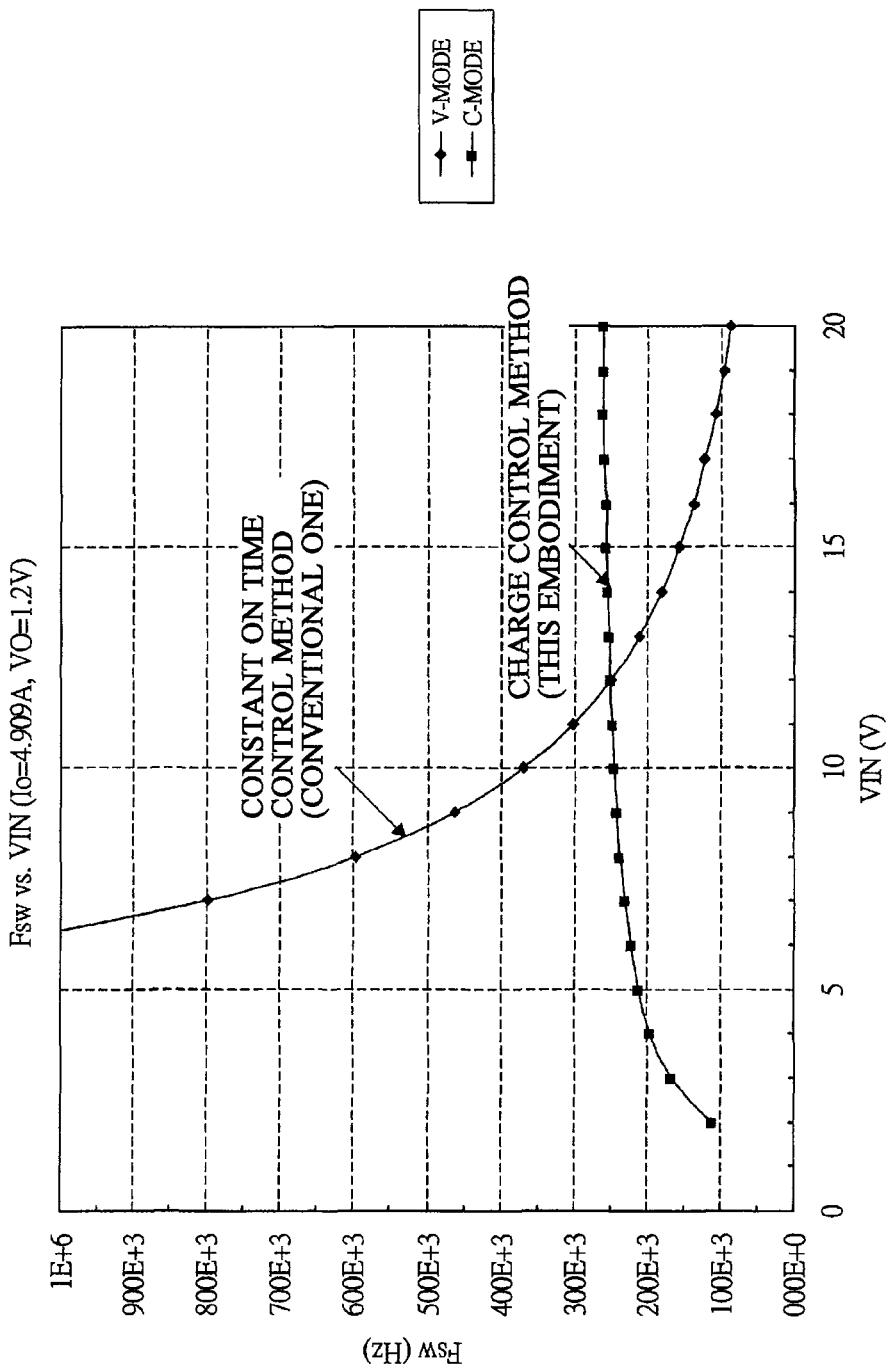
FIG. 5 is a graph showing an example of the input power source voltage dependence of the switching frequency at a light load operation in the power source device of FIG. 1.

FIG. 5 is a graph showing an example of the input power source voltage VIN dependence of the switching frequency Fsw in the operation at a light load (when the mode setting signal SMOD is in the 'H' level) in the power source device of FIG. 1. Note that, FIG. 5 also shows the case where the example of the configuration of FIG. 17 is used, as a comparative example. It can be appreciated that when the power source device (with the charge control method) of FIG. 1 is used, the dependence of the switching frequency Fsw on the input power source voltage VIN is small as compared with the example of the configuration (with the constant-ON control method) of FIG. 17.

Figure 6:
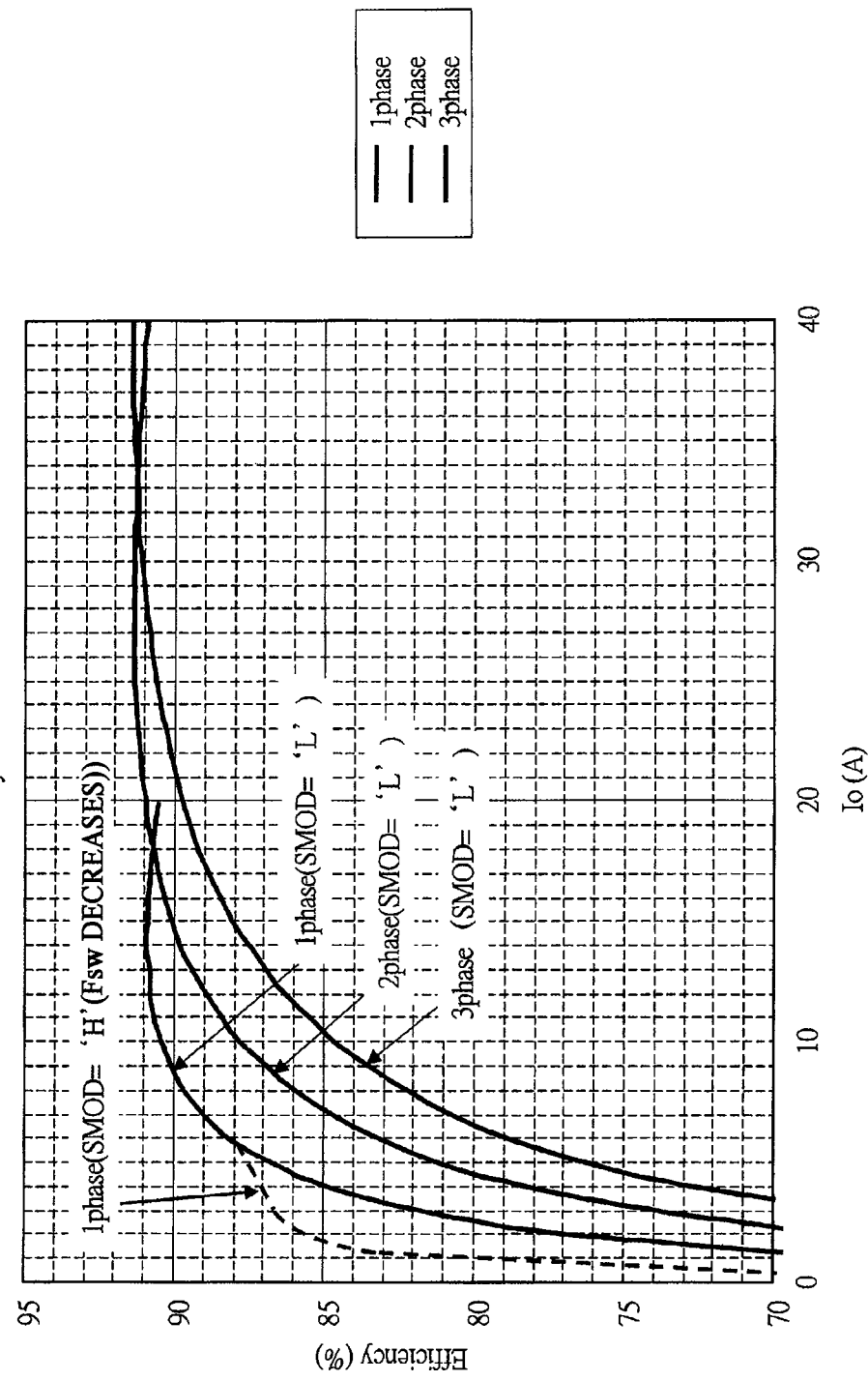
FIG. 6 is a graph showing an example of the load current dependence of the power conversion efficiency in each operation mode in the power source device of FIG. 1.

FIG. 6 is a graph showing an example of the load current Io dependence of the power conversion efficiency in each operation mode in the power source device of FIG. 1. As shown in FIG. 6, for example, at the level of Io>33 A, the power conversion efficiency of approximately 91% can be realized by using the three-phase operation as shown in FIG. 2A. Moreover, for example, at the level of 18 A<Io≦33 A, the power conversion efficiency of approximately 91% can be realized by using the two-phase operation as shown in FIG. 2B. Furthermore, for example, at the level of 11 A<Io≦18 A, the power conversion efficiency of approximately 91% can be realized by using the one-phase operation as shown in FIG. 2C.

However, even if the one-phase operation is used, the power conversion efficiency gradually decreases in the region at the level of Io≦11 A mainly due to the switching loss, and rapidly decreases in particular when Io≦6 A. However, by performing the operation as shown in FIG. 3 after the mode setting signal SMOD is set to the 'H' level as described above, the switching loss can be reduced and a relatively excellent power conversion efficiency can be maintained also in the region at the level of 2 A<Io≦6 A.

Thus, by using the power source device of FIG. 1, for example, the following effects can be acquired. Firstly, at a light load, the switching frequency can be reduced in response to the magnitude of the load. Moreover, the input power source voltage VIN dependence of the switching frequency Fsw can be reduced. As a result, particularly, in the battery-operated electronic devices represented by a note-book PC or the like, even if the battery voltage decreases, the approximately constant power conversion efficiency can be realized.

Figure 2:
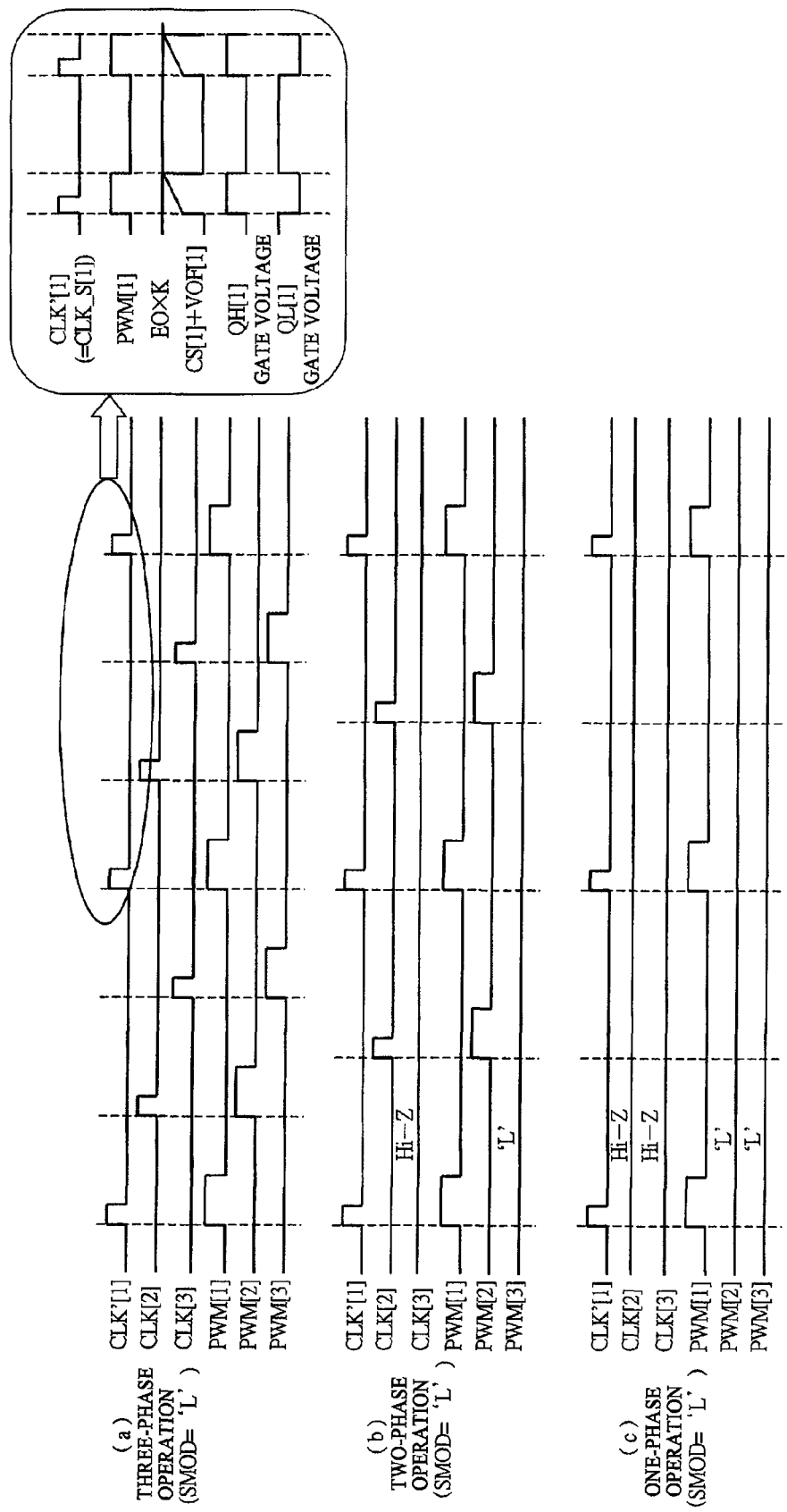
FIG. 2A is a waveform chart showing an example of a three-phase operation when a mode setting signal is set to an 'L' level in the power source device of FIG. 1.
FIG. 2B is a waveform chart showing an example of a two-phase operation when the mode setting signal is set to the 'L' level in the power source device of FIG. 1.
FIG. 2C is a waveform chart showing an example of a one-phase operation when the mode setting signal is set to the 'L' level in the power source device of FIG. 1.

Secondly, because the operation at a light load as shown in FIG. 3 is realized by applying the peak current control method, it is possible to easily switch between the operation at a light load and the multiphase operation as shown in FIG. 2 and realize the optimum power conversion efficiency for a load current with a wide range of fluctuation (i.e., for a wide range of current). Thirdly, if the external terminal PN2 of the switch signal SW is short-circuited to the ground power source voltage GND while QH is turned on, the current of QH is detected by the active-current detection circuit ACS and this result is immediately reflected on the PWM signal and also QH is turned off, and therefore the destruction of or damage to QH can be prevented.

<<Details of the Tristate Buffer Circuit>>

Figure 7:
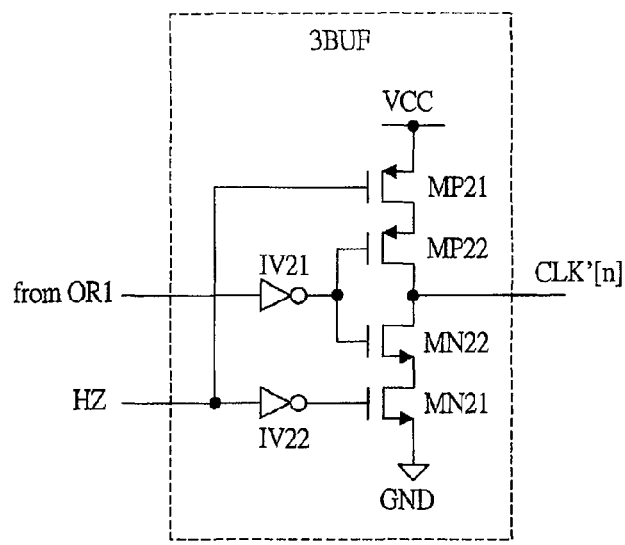
FIG. 7 is a circuit diagram showing an example of the detailed configuration of a tristate buffer circuit included in an analog companion unit in the power source device of FIG. 1.

FIG. 7 is a circuit diagram showing an example of the detailed configuration of the tristate buffer circuit 3BUF included in the analog companion unit ACU in the power source device of FIG. 1. 3BUF shown in FIG. 7 is the so-called clocked inverter circuit, and comprises PMOS transistors MP21, MP22, NMOS transistors MN21, MN22 and inverter circuits IV21, IV22. In MP21, the source thereof is coupled to a power source voltage VCC and the drain is coupled to the source of MP22. In MN21, the source thereof is coupled to the ground power source voltage GND and the drain is coupled to the source of MN22. Then, the drains of MP22 and MN22 are commonly coupled to each other and the clock signal CLK'[n] is output from this node.

When the high-impedance detection signal HZ is in the active state ('H' level), MP21 is turned off and MN21 is also turned off by an inversion signal of HZ via IV22, and CLK'[n] becomes a high impedance state. On the other hand, when HZ is in the inactive state ('L' level), MP21 and MN21 are turned on, and the signal from the OR circuit OR1 is output to CLK'[n] via the inversion operation by IV21 and the inversion operation by MP22, MN22.

<<Details of the High-Impedance Detection Circuit>>

Figure 8:
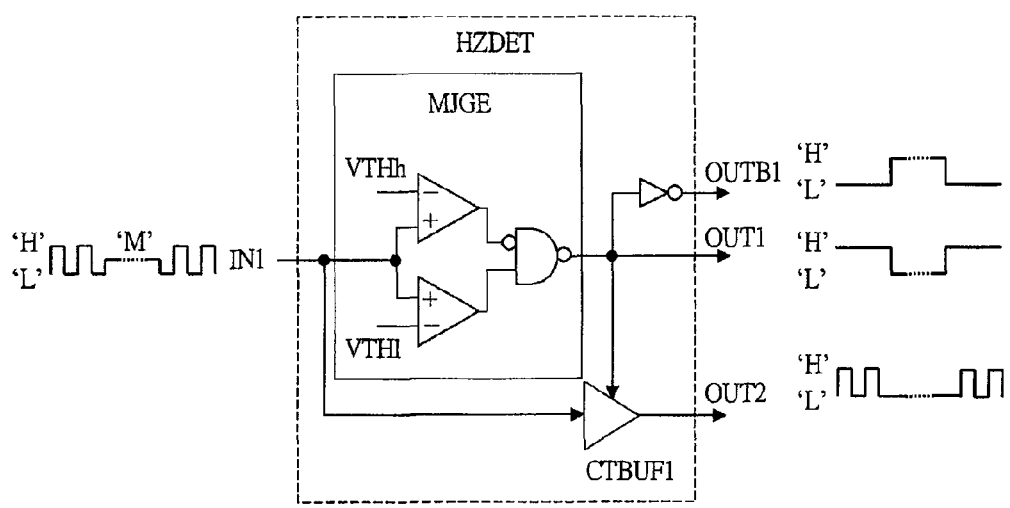
FIG. 8 is a circuit block diagram showing an example of the configuration of a high-impedance detection circuit included in the analog companion unit and each PWM-mounted drive unit in the power source device of FIG. 1.

FIG. 8 is a circuit block diagram showing an example of the configuration of the high impedance detection circuit HZDET included in the analog companion unit ACU and each PWM-mounted drive unit PSIP[n] in the power source device of FIG. 1. HZDET shown in FIG. 8 includes an intermediate level detection circuit MJGE and a controlled buffer circuit CTBUF1. MJGE sets an output signal OUT1 to the 'L' level (and sets an inverted output signal OUTB1 to the 'H' level) when the voltage level of the input signal IN1 is between a low ('L') level determination voltage VTH1 and a high ('H') level determination voltage VTHh, otherwise MJGE sets OUT1 to the 'H' level (and sets OUTB1 to the 'L' level).

The intermediate level detection circuit MJGE can be realized, for example, using two comparator circuits and the like. CTBUF1 outputs IN1 as an output signal OUT2 when OUT1 is in the 'H' level, and fixes OUT2 to the 'L' level (or 'H' level) when OUT1 is in the 'L' level. In HZDETm within ACU in FIG. 1, IN1, OUTB1, and OUT2 of FIG. 8 serve as CLK[1], HZ, and CLKi, respectively, while in HZDET1[1] within PSIP[1] in FIG. 1, IN1, OUT1, and OUT2 of FIG. 8 serve as CLK'[1], EN[1], and CLK_S[1], respectively.

Figure 9:
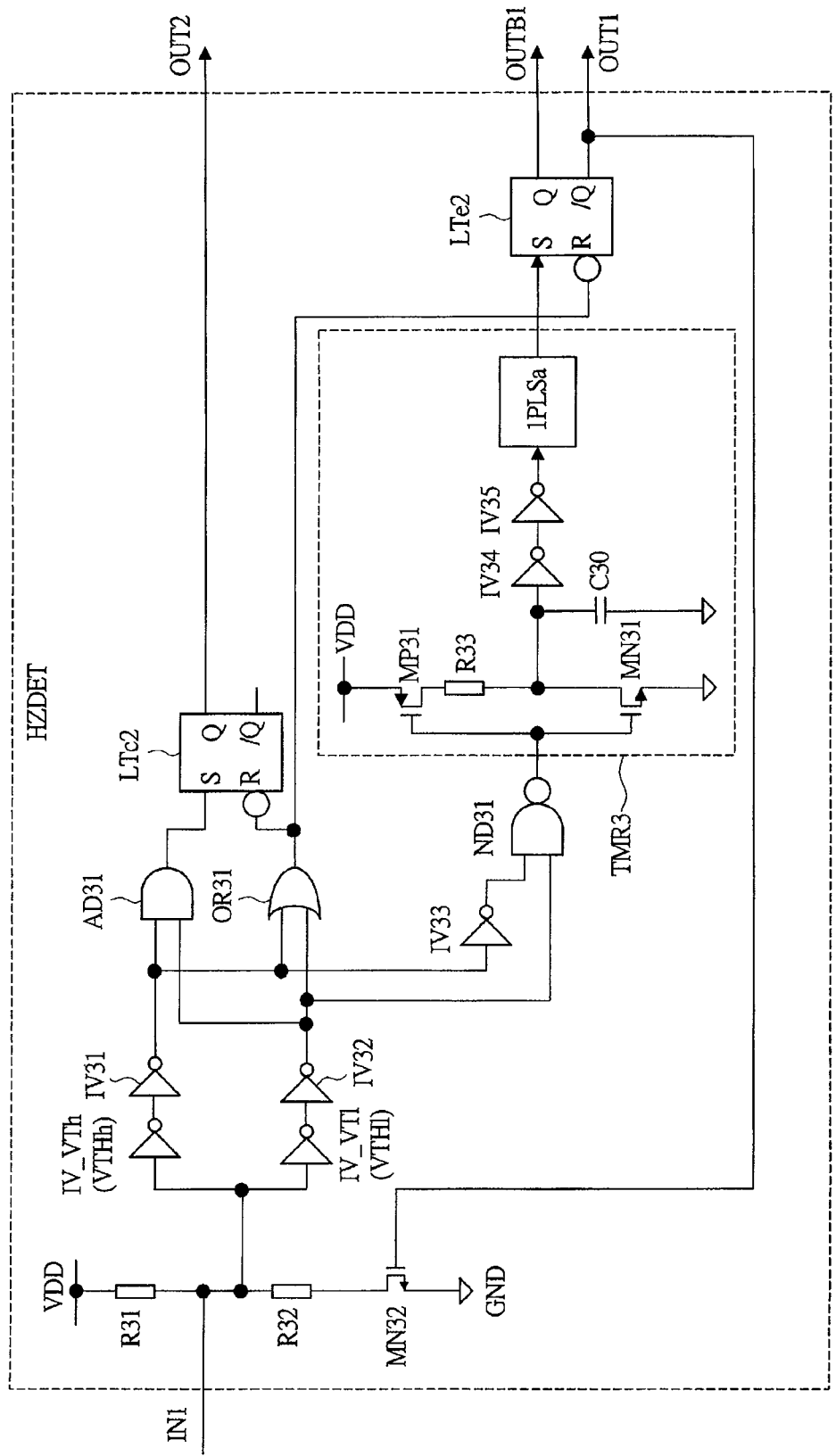
FIG. 9 is a circuit diagram showing an example of the more detailed configuration of the high-impedance detection circuit shown in FIG. 8.

FIG. 9 is a circuit diagram showing an example of the more detailed configuration of the high impedance detection circuit HZDET shown in FIG. 8. The high-impedance detection circuit HZDET shown in FIG. 9 includes resistors R31, R32, threshold setting inverter circuits IV_VTh, IV_VT1, inverter circuits IV31-IV33, an AND circuit AD31, an OR circuit OR31, a NAND circuit ND31, a timer circuit TMR3, set/reset latch circuits LTe2, LTc2, and an NMOS transistor MN32.

The resistor R31 is provided between the input node of the input signal IN1 and a power source voltage VDD (e.g., 5 V). In the resistor R32, one end thereof is coupled to the input node of IN1 and the other end is coupled to the drain of the NMOS transistor MN32. In MN32, the source thereof is coupled to the ground power source voltage GND and the gate is controlled by the output signal OUT1. The threshold setting inverter circuit IV_VTh has a threshold of the 'H' level determination voltage VTHh in FIG. 8 described above, and performs the inversion operation in response to IN1. The threshold setting inverter circuit IV_VT1 has a threshold of the 'L' level determination voltage VTH1 in FIG. 8 described above, and performs the inversion operation in response to IN1.

In both the AND circuit AD31 and the OR circuit OR31, the output of IV_VTh is input to one of two inputs via the inverter circuit IV31, and the output of IV_VT1 is input to the other input via the inverter circuit IV32. In the NAND circuit ND31, the output of IV_VTh is input to one of two inputs via IV31 and the inverter circuit IV33, and the output of IV_VT1 is input to the other input via the inverter circuit IV32.

The timer circuit TMR3 comprises a PMOS transistor MP31, an NMOS transistor MN31, a resistor R33, inverter circuits IV34, IV35, a capacitor C30, and a one-shot pulse generation circuit 1PLSa. In MP31, the source thereof is coupled to VDD, the gate is coupled to the output of ND31, and the drain is coupled to one end of R33. In MN31, the source thereof is coupled to GND, the gate is coupled to the output of ND31, and the drain is coupled to the other end of R33. C30 is coupled between the other end of R33 and GND. Moreover, the signal obtained from the other end of R33 is input to 1PLSa via IV34 and IV35. Upon detection of the rising edge in the output of IV35, 1PLSa outputs an 'H' pulse with a predetermined pulse width (e.g., 20 ns) once.

Here, although not limited in particular, for example, the resistor R33 has a resistance of 75 kO and the capacitor C30 has a capacitance of 2 pF. In this case, while the output of ND31 maintains the 'L' level, the voltage of the input node of IV34 gradually increases toward VDD with a time constant of R33×C30 (here, 150 ns). Then, when this voltage reaches the threshold voltage of IV34, a rising edge occurs at the output node of IV35. Note that, because the output of ND31 becomes the 'L' level when the voltage level of IN1 becomes an intermediate level which is higher than VTH1 and lower than VTHh, TMR3 will output a one-shot 'H' pulse only when this intermediate level continues for a certain period.

The set/reset latch circuit LTc2 performs a set operation in response to the 'H' level output from AD31, and performs a reset operation in response to the 'L' level output from OR31. LTc2 outputs the 'H' level to the output signal OUT2 in performing the set operation, and outputs the 'L' level to OUT2 in performing the reset operation. On the other hand, the set/reset latch circuit LTe2 performs the set operation in response to the 'H' level output from TMR3, and performs the reset operation in response to the 'L' level output from OR31. LTe2 outputs the 'L' level to OUT1 (and outputs the 'H' level to OUTB1) in performing the set operation, and outputs the 'H' level to OUT1 (and outputs the 'L' level to OUTB1) in performing the reset operation.

Figure 10:
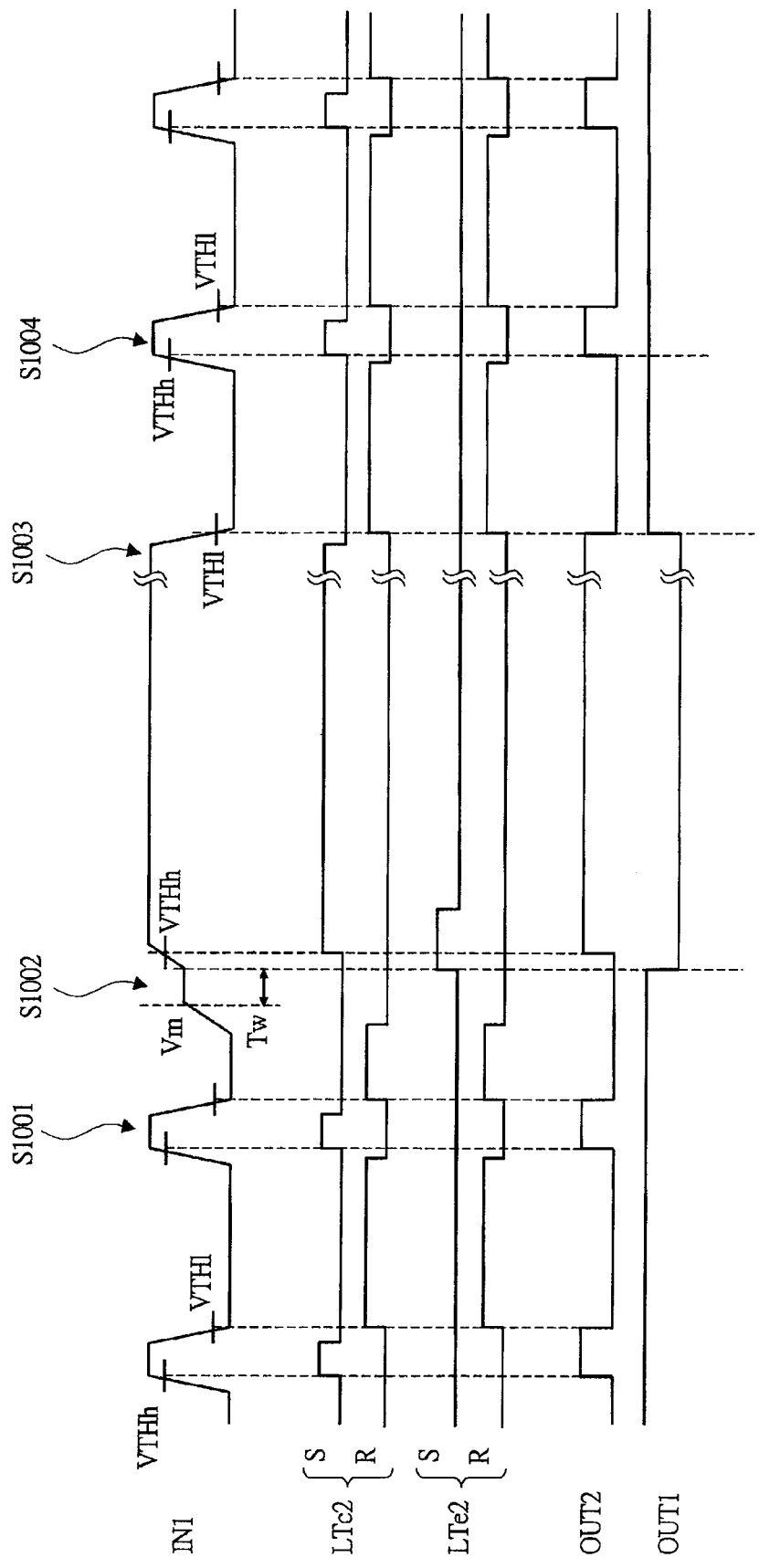
FIG. 10 is a waveform chart showing an example of the operation of the high-impedance detection circuit of FIG. 9.

FIG. 10 is a waveform chart showing an example of the operation of the high impedance detection circuit HZDET of FIG. 9. First, in FIG. 9, a period in which the set input (S) of LTc2 becomes the 'H' level is a period in which the voltage level of the input signal IN1 exceeds VTHh, while a period in which the reset input (R) becomes the 'H' level (/R becomes the 'L' level) is a period in which the voltage level of IN1 drops below VTH1. Moreover, a period in which the set input (S) of LTe2 becomes the 'H' level is a one-shot pulse period in which the voltage level of IN1 is an intermediate level and after the intermediate level continues for a certain period, while a period in which the reset input (R) becomes the 'H' level (/R becomes the 'L' level) is a period in which the voltage level of IN1 drops below VTH1.

Accordingly, as shown in S1001 of FIG. 10, during a period in which the input signal IN transits between the 'H' level and the 'L' level, if the voltage level of IN1 exceeds VTH1 as IN1 transits to the 'H' level, the reset input of LTc2 and LTe2 is returned to the 'L' level. Then, if the voltage level of IN1 further exceeds VTHh, LTc2 performs the set operation. Subsequently, if the voltage level of IN1 drops below VTHh as IN1 transits to the 'L' level, the set input of LTc2 is returned to the 'L' level, and if the voltage level of IN1 further drops below VTH1, LTc2 and LTe2 perform the reset operation. Thus, the same signal as IN1 is output to the output signal OUT2 and also the 'H' level is output to the output signal OUT1 (the 'H' level is maintained).

Next, as shown in S1002 of FIG. 10, during a period in which IN1 is in the high impedance state (at an intermediate level Vm), if the voltage level of IN1 exceeds VTH1 as IN1 transits to Vm, the reset inputs of LTc2 and LTe2 are returned to the 'L' level. Moreover, because ND31 outputs the 'L' level as long as the voltage level of IN1 is at an intermediate level not exceeding VTHh, if this intermediate level continues for a predetermined period (Tw) corresponding to C30×R33 described above, then the one-shot pulse is output from TMR3, and in response to this, LTe2 performs the set operation. Once this set operation is performed, OUT1 transits to the 'L' level and in response to this, MN32 is turned off. Thus, a shoot-through current through R31 and R32 is shut off.

On the other hand, once MN32 is turned off, the input node of IN1 rises toward the 'H' level. If the voltage of IN1 exceeds VTHh as the input node of IN1 rises, LTc2 performs the set operation and OUT2 transits to the 'H' level. Subsequently, OUT2 is fixed to the 'H' level unless IN1 transits to the 'L' level. Suppose that thereafter, as shown in S1003 of FIG. 10, IN1 returns from the high impedance state and transits to a period again in which IN1 transits between the 'H' level and the 'L' level, then, when the voltage level of IN1 drops below VTHh as IN1 transits to the 'L' level, the set input of LTc2 is returned to the 'L' level, while if the voltage level of IN1 further drops below VTH1, LTc2 and LTe2 perform the reset operation. Thus, OUT2 transits to the 'L' level and OUT1 transits to the 'H' level. Once OUT1 transits to the 'H' level, MN32 is turned on again. Thereafter, in S1004 of FIG. 10, the same operation as S1001 is performed.

Use of such a high-impedance detection circuit HZDET makes it possible to transmit the input signal and also detect the high impedance state of the input signal. Moreover, while the input signal is in the high impedance state, the shoot-through current through the resistors R31, R32 can be shut off and the current consumption can be reduced.

As described above, use of the power source device according to Embodiment 1 typically makes it possible to improve the power conversion efficiency at a light load independently of the input power source voltage. Moreover, the optimum power conversion efficiency can be realized for a load current with a wide range of fluctuation.

Note that, the power source device of FIG. 1 can be adequately modified including the configuration of its semiconductor package. For example, to support a higher load current, a PWM-mounted drive unit PSIP[4] may be added. In contrast, when there is a need just to support a small load current, only the common control unit CCTLU and PSIP[1]

may be provided. In this case, CCTLU and PSIP[1] can be realized also with one semiconductor package, for example.

(Embodiment 2)

Figure 11:
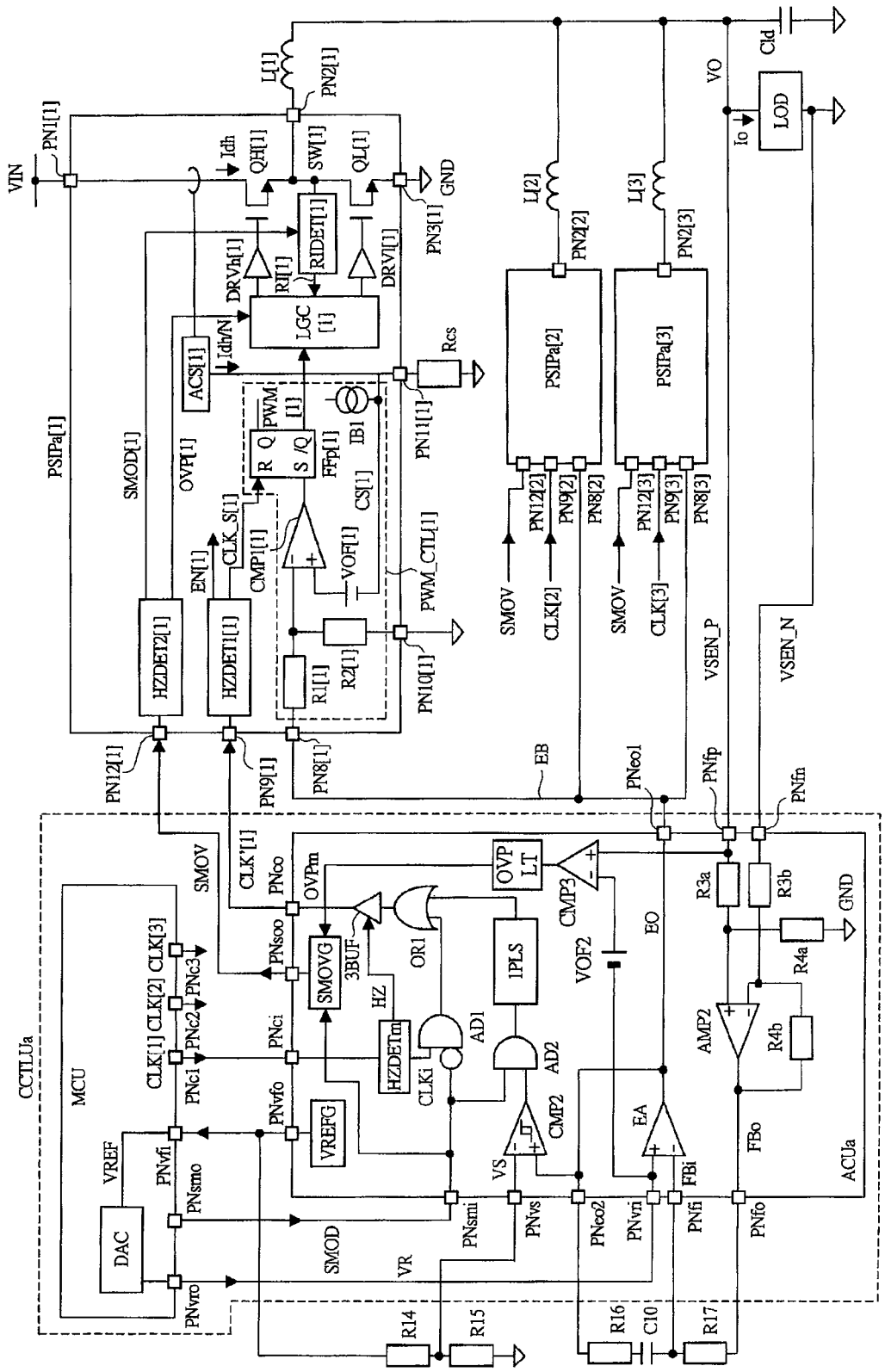
FIG. 11 is a circuit block diagram showing an example of the configuration of a power source device according to Embodiment 2 of the present invention.
Figure 12:
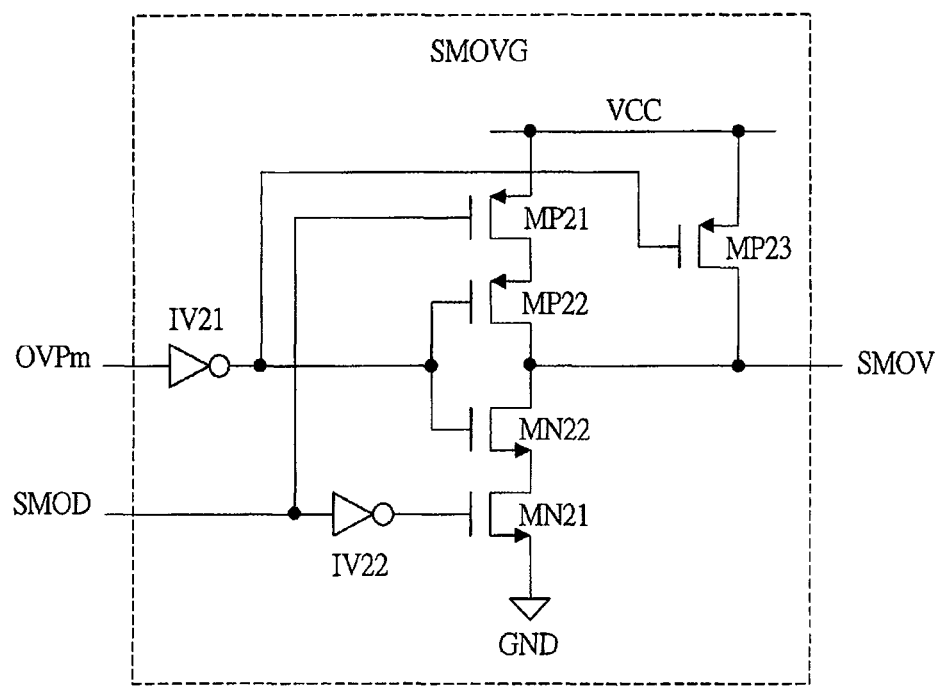
FIG. 12A is a circuit diagram showing an example of the detailed configuration of an SMOD&OVP output circuit in the analog companion unit in the power source device of FIG. 11.
FIG. 12B shows a truth table showing an example of the operation of the SMOD&OVP output circuit of FIG. 12A.

In Embodiment 2, a variation of the power source device shown in FIG. 1 is described. FIG. 11 is a circuit block diagram showing an example of the configuration of a power source device according to Embodiment 2 of the present invention. FIG. 12A is a circuit diagram showing an example of the detailed configuration of the SMOD&OVP output circuit SMOVG in the analog companion unit ACUa in the power source device of FIG. 11. FIG. 12B shows a truth table showing an example of the operation of the SMOD&OVP output circuit SMOVG of FIG. 12A. The power source device shown in FIG. 11 comprises a common control unit CCTLUa, a plurality of (here, three) PWM-mounted drive units PSIPa[1]-PSIPa[3], and a plurality of (here, three) inductors L[1]-L[3]. CCTLUa includes the microcontroller unit MCU and the analog companion unit ACUa.

The common control unit CCTLUa comprises several circuits added in the analog companion unit ACUa, as compared with the common control unit CCTLU of FIG. 1. The detailed description of the configuration other than these added circuits is omitted because it is the same as that of the common control unit CCTLU of FIG. 1. In ACUa shown in FIG. 11, an external terminal PNsoo, an SMOD&OVP output circuit SMOVG, an OVP latch circuit OVPLT, a comparator circuit CMP3, and an offset voltage source VOF2 are added, as compared with ACU of FIG. 1.

In the comparator circuit CMP3, the output voltage detection signal VSEN_P input via the external terminal PNfp is input to the (+) side, while to the (−) side, a voltage of the setting voltage VR, which is input via the external terminal PNvri, added with a voltage (e.g., 0.2 V) generated by the offset voltage source VOF2 is input. That is, CMP3 outputs the 'H' level when the voltage of the output power source node VO exceeds the setting voltage VR by a predetermined voltage (here, 0.2 V) or more. The OVP latch circuit OVPLT latches the 'H' level from the CMP3, and outputs an OVP signal (overvoltage detection signal) OVPm.

The SMOD&OVP output circuit SMOVG outputs an SMOD&OVP signal SMOV from the external terminal PNsoo in response to OVPm from OVPLT and the mode setting signal SMOD input via the external terminal PNsmo from MCU. SMOVG, for example, as shown in FIG. 12A, comprises a PMOS transistor MP23, whose drain is coupled to the output node and whose source is coupled to the power source voltage VCC, added to the clocked inverter circuit shown in FIG. 7. OVPm is input to the gates of PMOS transistors MP22, MP23 and NMOS transistor MN22 via an inverter circuit IV21, while SMOD is input to the gate of a PMOS transistor MP21, and is also input to the gate of an NMOS transistor MN21 via an inverter circuit IV22. Then, SMOV is output from an output node serving as the drains of MP22 and MN22.

If such an SMOD&OVP output circuit SMOVG is used, as shown in FIG. 12B, when the OVPm is in the 'H' level (i.e., when an overvoltage is detected), SMOV becomes the 'H' level regardless of the value of SMOD. In addition, when OVPm is in the 'L' level and SMOD is in the 'L' level (i.e., when the normal operation as shown in FIG. 2 is instructed), SMOV becomes the 'L' level, and when OVPm is in the 'L' level and SMOD is in the 'H' level (i.e., when the operation at a light load as shown in FIG. 3 is instructed), SMOV becomes a high impedance state.

On the other hand, each PWM-mounted drive unit PSIPa [n] (n=1, 2, 3) comprises the high-impedance detection circuit HZDET2[n] added thereto, as compared with each PSIP [n] of FIG. 1. The detailed description of the configuration other than the added circuit is omitted because it is the same as that of the PSIP[n] of FIG. 1. HZDET2[1] in PSIPa[1] operates in response to an input signal from the external terminal PN12[1]. Unlike the case of FIG. 1, SMOV from SMOVG in ACUa described above is input to the PN12[1]. Moreover, unlike the case of FIG. 1, SMOV is input to the external terminals PN12[2], PN12[3] in PSIPa[2], PSIPa[3] via a non-illustrated bus.

In response to SMOV, if SMOV is in a high impedance state, HZDET2[1] sets the mode setting signal SMOD[1] to the active state ('H' level), otherwise HZDET2[1] sets SMOD [1] to the inactive state ('L' level) and also outputs an OVP signal (overvoltage detection signal) OVP[1] corresponding to the level of SMOV. When SMOD[1] is in the 'H' level (that is, SMOV is in the high impedance state), the reverse-current detection circuit RIDET[1] is enabled as with the case of FIG. 1. In addition, OVP[1] is input to the control logic circuit LGC[1]. When OVP[1] is in the 'H' level (i.e., the 'H' level of SMOV), LGC[1] turns off QH[1] and turns on QL[1], thereby removing the overvoltage of the output power source node VO and preventing a destruction of the load LOD. Moreover, LGC[1] performs the normal PWM control operation when OVP[1] is in the 'L' level (i.e., the 'L' level of SMOV).

Here, in the example of the configuration of FIG. 11, SMOV is also transmitted to PSIPa[2] and PSIPa[3]. PSIPa [2] and PSIPa[3], as with PSIPa[1], perform an operation to prevent a destruction of the load LOD when they receive the 'H' level of SMOV (i.e., when the overvoltage is detected). On the other hand, when SMOV is in the high impedance state (i.e., when the operation at a light load is selected), no particular inconvenience is incurred because PSIPa[2] and PSIPa [3] have already been set so as to disable its own operation in response to the high impedance state of CLK[2], CLK[3], respectively, as described in FIG. 3.

Note that, in PSIPa[2] and PSIPa[3], the external terminals PN12[2], PN12[3] may be fixed to GND, as with the case of FIG. 1. In this case, when an overvoltage is detected, the operation to prevent the destruction of the load LOD is performed only by PSIPa[1]. Moreover, HZDET2[n] in each PSIP[n] can be realized with the configurations as shown in FIG. 8 and FIG. 9. In this case, IN1, OUTB1, and OUT2 of FIG. 8 and FIG. 9 serve as SMOV, SMOD[n], and OVP[n] of FIG. 1, respectively.

As described above, the use of the power source device according to Embodiment 2 typically makes it possible to improve the power conversion efficiency at a light load independently of the input power source voltage, as with Embodiment 1. Moreover, the optimum power conversion efficiency can be realized for a load current with a wide range of fluctuation. Furthermore, by transmitting tristate information between the external terminal PNsoo of ACUa and the external terminal PN12[n] of PSIPa[n], the protection function by the overvoltage detection can be realized with a small number of wirings as compared with the example of the configuration of Embodiment 1.

(Embodiment 3)

<<Detailed Circuit of the PWM-mounted Drive Unit>>

Figure 13:
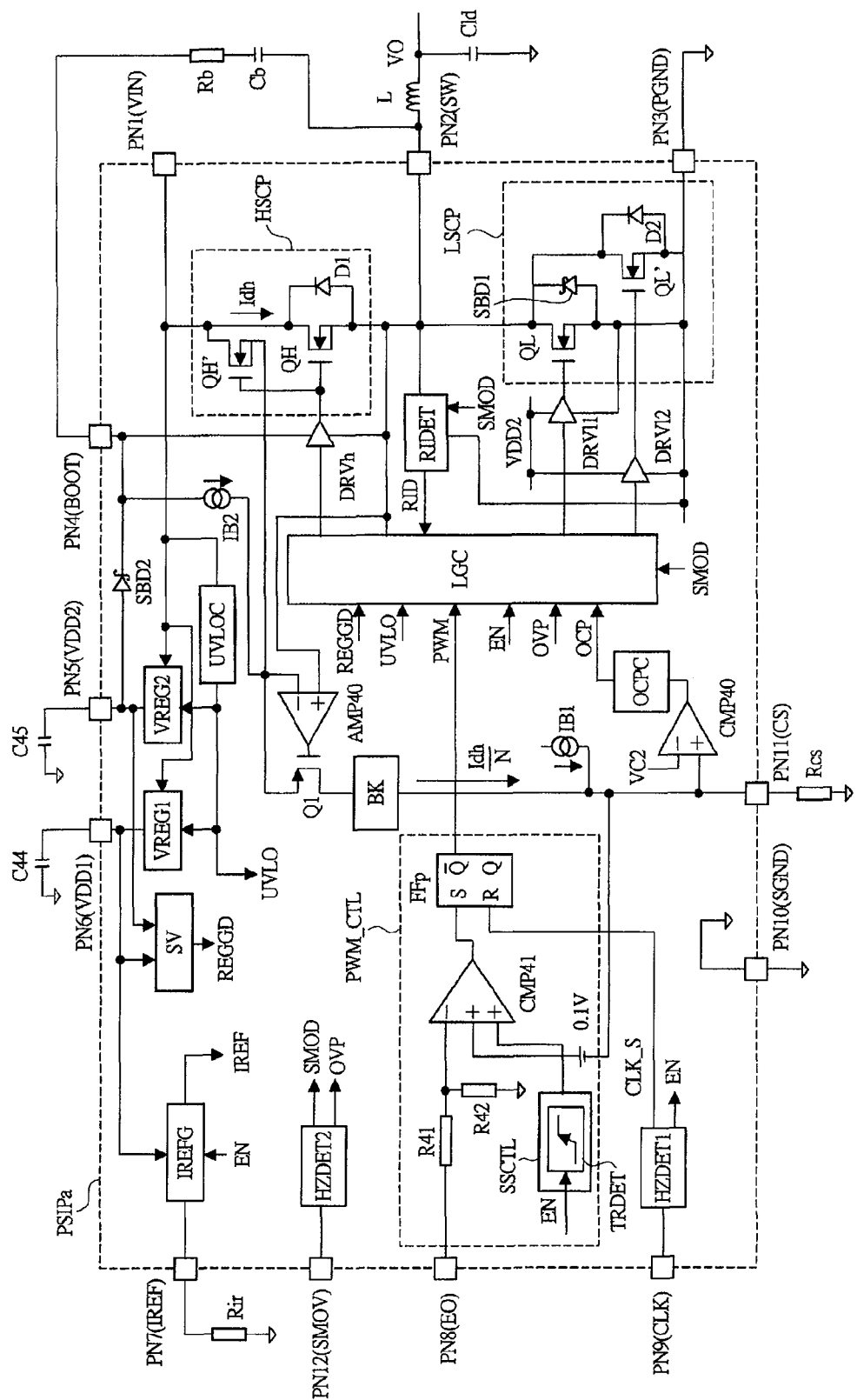
FIG. 13 is a block diagram showing an example of the detailed configuration of a power source device according to Embodiment 3 of the present invention.

In Embodiment 3 of the present invention, an example of the detailed configuration of the PWM-mounted drive unit PSIPa[n] (semiconductor device) included in the power source device described in Embodiment 2 is described. FIG. 13 is a block diagram showing an example of the detailed configuration of a power source device according to Embodiment 3 of the present invention. The PWM-mounted drive unit PSIPa serving as the semiconductor device shown in FIG. 13 mainly comprises high side transistors (power transistors) QH, QH', low side transistors (power transistors) QL, QL', and various control circuits for controlling each of the transistors, i.e., a circuit group other than these transistors.

QH, QH', QL, and QL' are n channel MOSFETs, for example. QH and QH' are formed in a high-side semiconductor chip HSCP, QL and QL' are formed in a low-side semiconductor chip LSCP, and various other control circuits are formed in a control semiconductor chip CTLCP. The respective semiconductor chips are mounted, for example, in one semiconductor package as described later. Diodes D1 and D2 are formed between the sources and drains of QH and QL', respectively, and a Schottky diode SBD1 is formed between the source and drain of QL. The SBD1 can reduce a voltage drop associated with the current path on QL (QL') side during a dead time particularly after turning off QH and before turning on QL (QL').

In QH, the gate thereof is driven by a drive circuit DRVh, the drain is coupled to an external terminal PN1 to which the input power source voltage VIN is supplied, and the source is coupled to an external terminal PN2 serving as the output terminal of the switch signal SW. In QL, the gate thereof is driven by a drive circuit DRVl1, the drain is coupled to PN2 (SW), and the source is coupled to an external terminal PN3 to which the ground power source voltage PGND is supplied. The PN3 (PGND) is the terminal dedicated for QH, QL, and is provided separately from the ground power source voltages SGND of various other control circuits and the like so as not to provide a switching noise to the various other control circuits and the like.

In QH', the gate thereof is driven by DRVh, the drain is coupled to PN1 (VIN), and the source is coupled to the source of a transistor (PMOS transistor) Q1. QH' is formed so as to constitute a current mirror circuit together with QH in HSCP, and has $1/18500$ size of QH, for example. On the other hand, in QL', the source and drain thereof are coupled in parallel to QL, and the gate is driven by DRVl2. QL' has, for example, $1/10$ size of QL in LSCP.

The source (SW) of QH and the source of QH' are coupled to two input nodes of an amplifier circuit AMP40, respectively. Then, the gate of the transistor Q1 is driven by the output node of AMP40. QH' is an element for detecting the current Idh flowing through QH. When the source voltages of QH' and QH are equal to each other, a current of Idh/18500 flows through QH' due to the current mirror configuration described above. Then, in order to set the source voltages of QH' and QH equal to each other and accurately detect the current of QH, AMP40 and Q1 are provided. In addition, a bias current source IB2 is coupled to the source of Q1. The IB2 is provided so as to be able to set the source voltages of QH and QH' equal to each other even when the current IL of QH is approximately zero.

The current detected by the transistor QH' is input to a blanking circuit BK through the transistor Q1. BK sets the switching periods of QH and QL (QL') to a masking period (e.g., several tens of ns), and supplies the current detection signal CS generated by QH' to an external terminal PN11 except this period. An external resistor Rcs for current to voltage conversion is coupled to PN11 (CS), and thereby the signal CS is converted to a voltage. Note that the bias current source IB1 for stabilization is coupled to PN11 (CS).

The drive circuit DRVh drives the transistors QH, QH' based on the control from the control logic circuit LGC, the drive circuit DRVl1 drives the transistor QL based on the control from LGC, and the drive circuit DRVl2 drives the transistor QL' based on the control from LGC. The input power source voltage VIN (e.g., 12 V etc.) from the external terminal PN1 is supplied to an input voltage detection circuit UVLOC and regulator circuits VREG1, VREG2. UVLOC detects that the input power source voltage VIN is equal to or greater than a predetermined voltage (e.g., 8 V etc.), and, if so, enables the operations of VREG1, VREG2 via an input voltage detection signal UVLO. VREG1 and VREG2 generate internal power source voltages, such as approximately 5 V, in response to VIN. VREG1 supplies a generated internal power source voltage VDD1 to various control circuits and also outputs this to an external terminal PN6. VREG2 supplies a generated internal power source voltage VDD2 to the drive circuits DRVh, DRVl1, DRVl2, and the like and also outputs this to an external terminal PN5. Capacitors C44, C45 for voltage stabilization are coupled to PN6 (VDD1), PN5 (VDD2), respectively.

Here, the drive circuits DRVh, DRVl1, and DRVl2 need a relatively high current in order to drive the transistors QH, QH', QL, and QL', and therefore generate a lot of noises. On the other hand, various other control circuits need to reduce power source noises because these control circuits include many analog circuits, such as an amplifier circuit, therein. Then, these power supplies are individually generated by two regulator circuits VREG1, VREG2. Moreover, a regulator voltage monitor circuit SV monitors the internal power source voltages which VREG1 and VREG2 generate, and if these are within a predetermined range, the regulator voltage monitor circuit SV outputs an internal power supply enable signal REGGD.

A boost voltage BOOT is generated at an external terminal PN4 and supplied as the power source voltage of the drive circuit DRVh. PN4 (BOOT) is coupled to the external terminal PN5 (VDD2) via a Schottky diode SBD2, and also coupled to the external terminal PN2 (SW) via an external boosting capacitor Cb and an external resistor Rb. When the transistor QH is turned off, the internal power source voltage VDD2 is applied to this Cb via SBD2 and PN4 (BOOT). Subsequently, when QH is turned on, the input power source voltage VIN transferred by SW is boosted by this Cb and supplied to DRVh. Thus, DRVh can generate a voltage of the threshold of QH or more.

The control logic circuit LGC operates in response to the internal power supply enable signal REGGD, the input voltage detection signal UVLO, the PWM signal (PWM), the enable signal EN, the overvoltage detection signal OVP, an overcurrent detection signal OCP, and the mode setting signal SMOD. REGGD is generated from the regulator voltage monitor circuit SV, UVLO is generated from the input voltage detection circuit UVLOC, and the PWM signal (PWM) is generated from the PWM control circuit PWM_CTL. Moreover, EN is generated from the high-impedance detection circuit HZDET1, OCP is generated from the overcurrent detection circuit OCPC, and OVP and SMOD are generated from the high-impedance detection circuit HZDET2. OCPC operates in response to the output of a comparator circuit CMP40. CMP40 compares the voltage of the external terminal PN11 (CS) with a comparison voltage VC2, and outputs the comparison result to OCPC. As a result of this comparison, if the voltage of CS is excessive (i.e., if an excessive current flows through the transistor QH), OCPC activates OCP.

When REGGD, UVLO, and EN are concurrently activated and both OVP and OCP are deactivated, LGC controls the drive circuits DRVh, DRVl1, and DRVl2 using the PWM signal (PWM). On the other hand, when either one of REGGD, UVLO, and EN is deactivated or when OCP is activated, LGC turns off all of QH, QL, and QL', and when OVP is activated, LGC turns off QH and turns on QL and/or QL'. Here, the case where REGGD is in an active state means that a sufficient internal power source voltage is generated, the case where UVLO is in an active state means that the input power source voltage VIN is a sufficient voltage, and the case where EN is in an active state means that an instruction to enable the device has been input from the outside. Moreover, the case where OCP is in an inactive state means that an excessive current is not flowing through QH, and the case where OVP is in an inactive state means that an excessive voltage is not generated at the output power source node VO.

The clock signal CLK is input to the external terminal PN9. CLK is input to the high-impedance detection circuit HZDET1 as described above, and HZDET1 generates the enable signal EN and the internal clock signal CLK_S. Moreover, the SMOD&OVP signal SMOV is input to the external terminal PN12 (SMOV). SMOV is input to the high-impedance detection circuit HZDET2 as described above, and HZDET2 generates the mode setting signal SMOD and the OVP signal (overvoltage detection signal) OVP.

The PWM control circuit PWM_CTL comprises resistors R41, R42, a comparator circuit CMP41, a flip-flop circuit FFp, and a soft start control circuit SSCTL. R41 and R42 divide the error amplifier signal EO input from an input terminal PN8, and apply the resultant voltage to the (−) input node of CMP41. A signal produced by adding an offset voltage (here, 0.1 V) to the current detection signal CS obtained from PN11 is applied to one (+) input node of CMP41. The output signal from SSCTL is applied to the other (+) input node of CMP41. CMP41 determines the voltage of the (−) input node with reference to the lower voltage of the voltages of two (+) input nodes.

The soft start control circuit SSCTL includes a rising edge detection circuit TRDET detecting the rising edge of the enable signal EN, and generates a gradually increasing voltage in performing this detection. This SSCTL is used when a certain phase is disabled by EN according to a state of the current consumption of the load LOD in the course of a multiphase operation and is subsequently enabled again. That is, because the voltage of the error amplifier signal EO from the external terminal PN8 is high when EN is enabled, a recovery operation is performed by a soft start using SSCTL. The flip-flop circuit FFp performs the set operation in response to the output of CMP41 and performs the reset operation in response to CLK_S. Then, an inverted output signal (/Q) from FFp is output to the control logic circuit LGC as the PWM signal (PWM).

A reference current generation circuit IREFG operates with the internal power source voltage VDD1, and generates a plurality of reference currents IREF according to a reference current setting resistor Rir coupled to an external terminal PN7. These reference currents IREF are, for example, the bases for the bias current sources IB1, IB2, and are supplied to various control circuits, including the operation currents of the comparator circuits CMP40, CMP41 and the amplifier circuit AMP40. When the enable signal EN is deactivated, IREFG stops a part of or all of current generation in the reference currents IREF and thus transits to the power saving mode.

Moreover, when the mode setting signal SMOD is in an active state (i.e., when the operation at a light load described in FIG. 3 is instructed), the operation of the reverse-current detection circuit RIDET is enabled. In this case, RIDET monitors the voltage between the source and drain of QL' (QL), for example, and outputs a reverse flow detection signal RID upon detection of a current flowing from the PN2 (SW) side toward the PN3 (PGND) side.

When the mode setting signal SMOD is in an active state (i.e., when the operation at a light load described in FIG. 3 is instructed), the control logic circuit LGC performs the operation at a light load by using QL' (switching control) instead of using QL (i.e., QL is fixed to the OFF state). Note that, when the reverse flow detection signal RID is input during this operation period at a light load, LGC turns off QL' as described in FIG. 3. On the other hand, when SMOD is in an inactive state (i.e., when the normal operation as described in FIG. 2 is instructed), LGC performs the normal operation by using both QL and QL' (switching control). Thus, the use of QL and QL' facilitates the detection of a reverse flow in the operation at a light load because the on-resistance of QL' is larger than that of QL due to a difference in the transistor size, as described in Patent Document 3.

<<Package Configuration of the PWM-mounted Drive Unit>>

Figure 14:
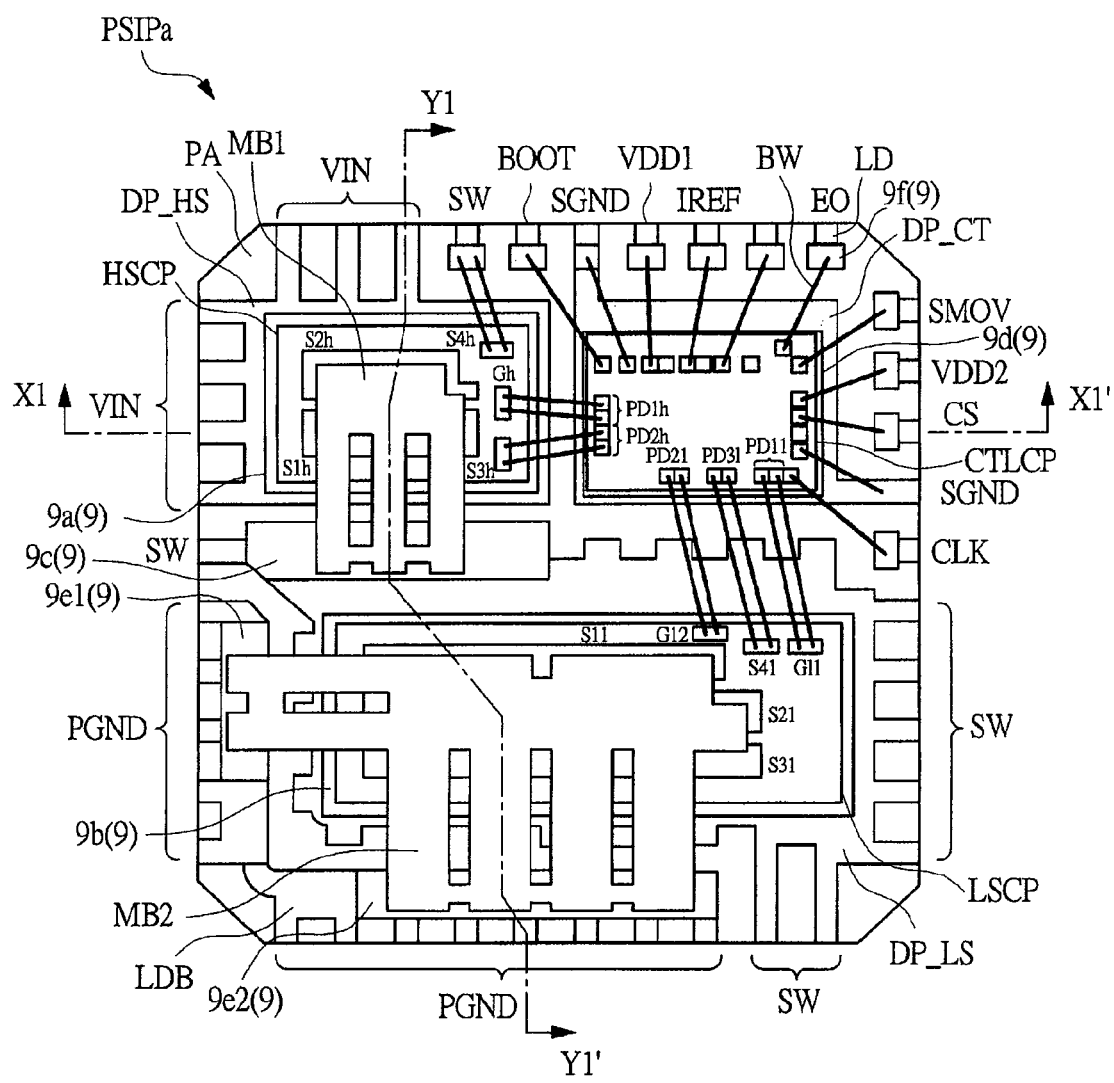
FIG. 14 is a plan view showing an example of the outer shape of the PWM-mounted drive unit shown in FIG. 13.

FIG. 14 is a plan view showing an example of the outline of the PWM-mounted drive unit (PSIPa) shown in FIG. 13. FIG. 15A is a cross sectional view showing an example of the structure along Y1-Y1' in FIG. 14, and FIG. 15B is a cross sectional view showing an example of the structure along X1-X1' in FIG. 14.

The PWM-mounted drive unit (PSIPa) shown in FIG. 14 has a QFN (Quad Flat Non-leaded package) surface mount semiconductor package (sealed body) PA, for example. The material of PA is, for example, an epoxy resin or the like. PA includes three die pads DP_HS, DP_LS, and DP_CT each mounting a semiconductor chip therein, a lead wire LDB, and a plurality of leads LD serving as external terminals. The planar area in PA is divided into halves, wherein DP_HS and DP_CT are disposed in one of the half areas and DP_LS and LDB are disposed in the other half area. Both DP_HS and DP_CT have a generally rectangular planar shape, respectively, and are disposed adjacent to each other. DP_LS has a generally rectangular planar shape and LDB has an L-shaped planar shape. LDB is disposed between two perpendicular sides in DP_LS and two perpendicular sides in PA.

In the upper surfaces of the die pads DP_HS, DP_LS, and DP_CT, plated layers 9a, 9b, and 9d are formed, respectively, and the semiconductor chips HSCP, LSCP, and CTLCP are mounted via these plated layers 9a, 9b, and 9d. As described in FIG. 13, the high side transistors QH, QH' are formed in the semiconductor chip HSCP, the low side transistors QL, QL' are formed in the semiconductor chip LSCP, and various other control circuits are formed in the semiconductor chip CTLCP. Here, the area of LSCP is designed approximately two times larger than that of HSCP. For example, when the input power source voltage VIN of 12 V is converted to the output power source voltage of 1.0 V, the time to turn on QL, QL' is approximately ten times longer than the time to turn on QH. Therefore, an increase of the area of LSCP can reduce the on-resistance and increase the power efficiency of the power source device.

Moreover, in each of the die pads DP_HS, DP_LS, and DP_CT, the lower surface thereof is exposed from the backside of PA. Among these, the exposed area of DP_LS is the largest and the exposed area of DP_HS is the next largest. This can reduce the on-resistance of QL and improve its radiation performance, in particular. The plated layer 9c is formed in the upper surface of DP_LS. Furthermore, the plated layers 9e1, 9e2 are formed in the upper surface of the lead wire LDB, and the plated layer 9f is formed in the upper surface of the lead LD. Each of the die pads DP_HS, DP_LS, and DP_CT, the lead wire LDB, and the lead LD are formed from a metal, for example, such as copper (Cu), as the main material. Each of the plated layers 9a, 9b, 9c, 9d, 9e1, 9e2, and 9f is, for example, a silver (Ag) plated layer, a gold (Au) plated layer, or the like.

The semiconductor chip HSCP includes a drain electrode in the backside, and includes a plurality of source electrodes S1h-S4h and a gate electrode Gh in the surface. Thus, the drain electrode is electrically coupled to DP_HS. The source electrodes S1h-S4h are coupled to each other with an internal wiring of HSCP. Moreover, the semiconductor chip LSCP includes a drain electrode in the backside and includes a plurality of source electrodes S11-S41 and a plurality of gate electrodes G11, G12 in the surface. This drain electrode is electrically coupled to DP_LS. The source electrodes S11-S41 are coupled to each other with an internal wiring of LSCP. Moreover, the semiconductor chip CTLCP includes a plurality of electrodes including electrodes PD1h, PD2h, PD11, PD21, and PD31 in the surface. The backside of CTLCP is electrically coupled to DP_CT.

In the periphery of the die pad DP_HS, a plurality of (here, seven) leads (external terminals) LD for the input power source voltage VIN and a lead LD for the switch signal SW are disposed. Among these, the leads LD for the input power source voltages VIN are formed integrally with DP_HS. Accordingly, the drain electrode of HSCP is electrically coupled to the leads LD for VIN via DP_HS. In the periphery of the die pad DP_LS, a plurality of (here, eight) leads LD for SW is disposed. The leads LD for SW are formed integrally with DP_LS. Accordingly, the drain electrode of LSCP is electrically coupled to the leads LD for SW via DP_LS. In the periphery of lead wire LDB, a plurality of (here, thirteen) leads LD for the ground power source voltage PGND is disposed. The leads LD for PGND are formed integrally with LDB.

In the periphery of the die pad DP_CT, a plurality of (here, two) leads LD for the ground power source voltage SGND is disposed. The leads LD for SGND are formed integrally with DP_CT. Accordingly, the backside of CTLCP is electrically coupled to the leads LD for SGND via DP_CT. Furthermore, in the periphery of DP_CT, the leads for the clock signal CLK, for the current detection signal CS, for the internal power source voltage VDD2, for SMOV for the SMOD&OVP signal, for the error amplifier signal EO, for the reference current IREF, for the internal power source voltage VDD1, and for the boost voltage BOOT are disposed, respectively. These leads LD are respectively coupled to the above-described electrodes provided in the surface of CTLCP, via the plated layer 9f and bonding wires BW.

The package PA shown in FIG. 14 further includes two metal plates (conductor plates) MB1, MB2. MB1 and MB2 are formed from a metal having a high electrical conductivity and a high thermal conductivity represented by copper (Cu), for example. MB1 couples the source electrodes S1h, S2h provided over the semiconductor chip HSCP with the plated layer 9c formed over the die pad DP_LS. Thus, the source of HSCP is coupled to the lead LD for the switch signal SW. MB2 couples the source electrodes S11-S31 provided over the semiconductor chip LSCP with the plated layers 9e1, 9e2 formed in two places over the lead wire LDB, respectively. Thus, the source of LSCP is coupled to the lead LD for the ground power source voltage PGND.

The source electrode S4h provided over the semiconductor chip HSCP is coupled to the lead LD for SW disposed in the periphery of DP_HS, via the bonding wire BW and the plated layer 9f. The gate electrode Gh and source electrode S3h provided over HSCP are coupled to the electrodes PD1h, PD2h provided over the semiconductor chip CTLCP, via BW, respectively. The gate electrode G11, gate electrode G12 and source electrode S41 provided over LSCP are coupled to the electrodes PD11, PD21, and PD31 provided over CTLCP, via BW, respectively. PD1h and PD2h correspond to the output node and reference voltage node, respectively, of the drive circuit DRVh in FIG. 13. PD11 and PD21 correspond to the output node of the drive circuit DRVl1 and the output node of the drive circuit DRVl2, respectively, in FIG. 13, and PD31 corresponds to the reference voltage node of DRVl1, DRVl2.

Moreover, as shown in FIGS. 15A, 15B, a plated layer 10 is formed over the lower surface of the lead LD exposed in the backside of the package PA and over the lower surfaces of the die pads DP_HS, DP_LS, and DP_CT. The plated layer 10 is a solder plating layer, and is a plated layer formed after the formation of package PA. The plated layer 10 is provided so as to facilitate a soldering connection to a wiring board (PCB) when PSIPa is mounted above this PCB. The semiconductor chips HSCP, LSCP, and CTLCP are connected to the plated layers 9a, 9b, and 9d via an adhesive layer 11a, respectively, and HSCP and LSCP are connected to metal plates MB1, MB2 via an adhesive layer 11b, respectively. MB1 is connected to the plated layer 9c via an adhesive layer 11c, and MB2 is connected to a plated layer 9e2 (9e1) via the adhesive layer 11c. The adhesive layers 11a-11c are formed from solder. Moreover, the bonding wire BW from CTLCP is connected to the plated layer 9f.

By packaging a plurality of semiconductor chips into one semiconductor package in this manner, a reduction in the size of the power source device can be realized, and additionally an increase in the frequency and an improvement in the efficiency can be achieved because the wire's parasitic inductance can be reduced. Moreover, by exposing the lower surface of each of the die pads DP_HS, DP_LS, and DP_CT as an electrode from the backside of the package PA, a reduction in the resistance of the electrode or an improvement in the radiation performance can be achieved. Furthermore, by making connection using two metal plates (conductor plates) MB1, MB2, a reduction in the resistance in the connection part or an improvement in the radiation performance can be achieved as compared with the case where the bonding wire BW is used. These can reduce the power loss and improve the power conversion efficiency.

<<Device Structure of the PWM-mounted Drive Unit>>

Figure 16:
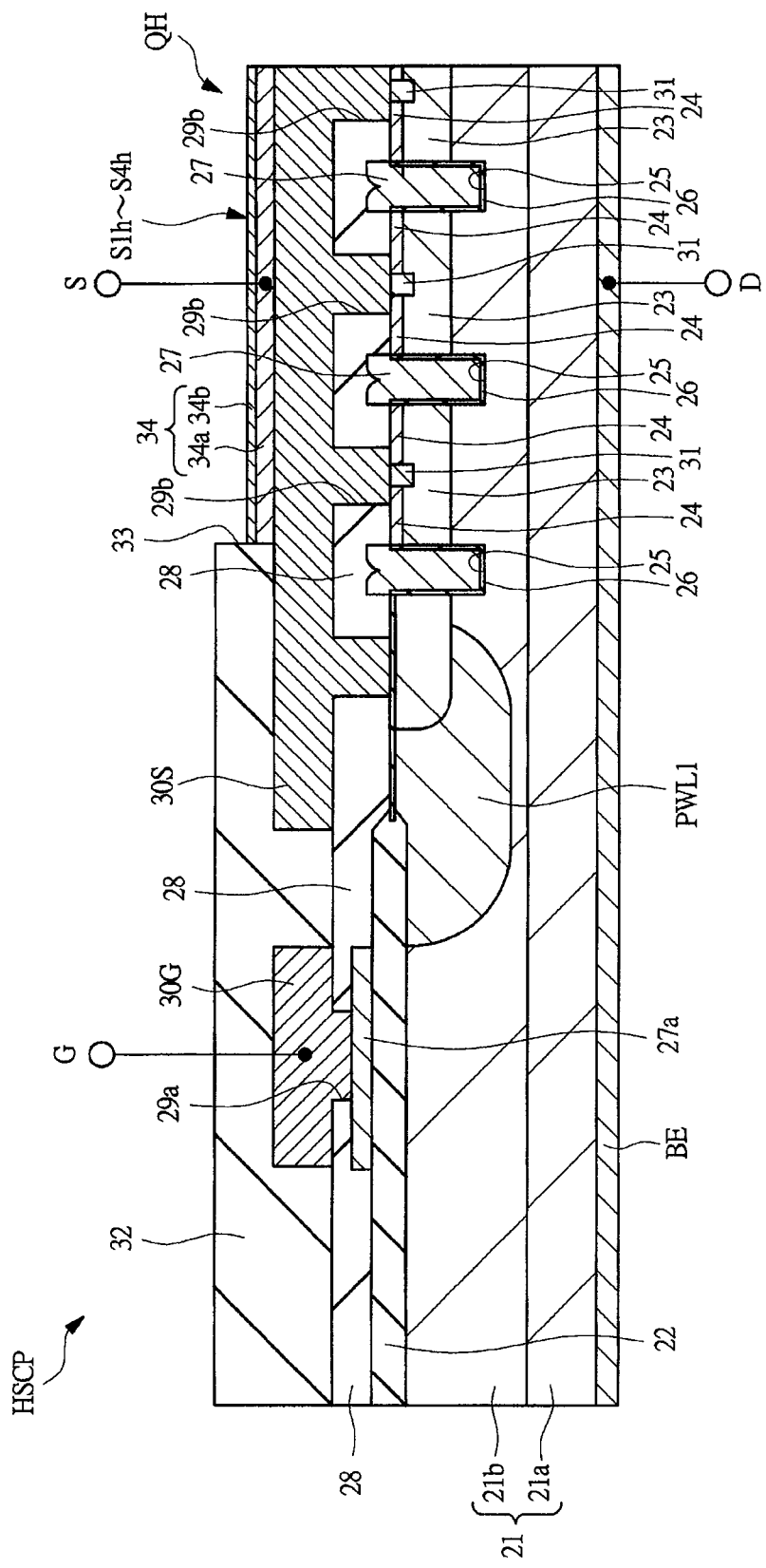
FIG. 16 is a cross sectional view showing an example of the device structure of a semiconductor chip having a high side transistor formed therein in FIG. 13.

FIG. 16 is a cross sectional view showing an example of the device structure of the semiconductor chip HSCP having the high side transistor formed therein in FIG. 13. Here, the high side transistors (power transistors) QH, QH' are taken as an example, however, the low side transistors QL, QL' also have the same structure. The transistors QH, QH' are formed in the principal surface of a semiconductor substrate 21 including a substrate body 21a made of an n+ single crystal silicon or the like and an epitaxial layer 21b made of an n− silicon single crystal or the like. In the principal surface of the epitaxial layer 21b, a field insulating film (element isolating region) 22 made of, for example, silicon oxide or the like is formed.

In an active region surrounded by the field insulating film 22 and a p-well PWL1 thereunder, a plurality of unit transistor cells constituting QH, QH' is formed. QH is formed by connecting these unit transistor cells in parallel. On the other hand, QH' is formed by setting the number of unit transistor cells connected in parallel to 1/18500 of QH, for example. Each unit transistor cell is formed from an n-channel MOS transistor with a trench gate structure, for example.

The substrate body 21a and the epitaxial layer 21b have the function as the drain region of the unit transistor cell. In the backside of the semiconductor substrate 21, a backside electrode BE for the drain electrode is formed. The backside electrode BE is formed, for example, by stacking a titanium (Ti) layer, a nickel (Ni) layer, and a gold (Au) layer sequentially from the backside of the semiconductor substrate 21. In PSIPa shown in FIGS. 15A, 15B, the backside electrode BE is bonded to the die pad DP_HS (plated layer 9a) via the adhesive layer 11a to be electrically coupled thereto.

Moreover, a p-type semiconductor region 23 formed in the epitaxial layer 21b has the function as a channel forming region of the above-described unit transistor cell. Furthermore, an n+-type semiconductor region 24 formed in the upper side of the p-type semiconductor region 23 has the function as the source region of the unit transistor cell. Moreover, in the semiconductor substrate 21, a groove 25 extending in the thickness direction of the semiconductor substrate 21 from the principal surface is formed. The groove 25 is formed so as to extend from the upper surface of the n+-type semiconductor region 24 through the n+-type semiconductor region 24 and p-type semiconductor region 23 and terminate in the epitaxial layer 21b thereunder. In the bottom surface and side face of the groove 25, a gate insulating film 26 made of silicon oxide, for example, is formed.

In the groove 25, a gate electrode 27 is embedded via the gate insulating film 26. The gate electrode 27 is made of a polysilicon film doped with an n-type impurity, for example. The gate electrode 27 has the function as the gate electrode of the above-described unit transistor cell. Moreover, also in a part over the field insulating film 22, a gate lead-out wiring part 27a made of an electrical conductive film of the same layer as the gate electrode 27 is formed, and the gate electrode 27 and the gate lead-out wiring part 27a are integrally formed to electrically couple to each other. Note that, in a region not illustrated in the cross sectional view of FIG. 16, the gate electrode 27 and the gate lead-out wiring part 27a are integrally coupled to each other. The gate lead-out wiring part 27a is electrically coupled to a gate wiring 30G through a contact hole 29a formed in the insulation film 28 covering the gate lead-out wiring part 27a.

On the other hand, a source wiring 30S is electrically coupled to the n+-type semiconductor region 24 for the source through a contact hole 29b formed in the insulation film 28. Moreover, the source wiring 30S is electrically coupled to a p+-type semiconductor region 31, which is formed in the upper part of the p-type semiconductor region 23 and between the adjacent n+-type semiconductor regions 24. Through the p+-type semiconductor region 31, the source wiring 30S is electrically coupled to the p type semiconductor region 23 for channel formation. The gate wiring 30G and the source wiring 30S can be formed by forming a metal film (e.g., aluminum film) so as to fill the contact holes 29a, 29b over the insulation film 28 in which the contact holes 29a, 29b are formed, and patterning this metal film.

The gate wiring 30G and the source wiring 30S are covered with a protective film (insulation film) 32 made of a polyimide resin or the like. The protective film 32 is a film (insulation film) of the uppermost layer of the semiconductor chip HSCP. In a part of the protective film 32, there is formed an opening 33, through which a part of the gate wiring 30G and a part of the source wiring 30S under the protective films 32 are exposed. Here, the gate wiring 30G portion exposed from the opening 33 serves as the above-described gate electrode Gh and the source wiring 30S portion exposed from the opening 33 serves as the above-described source electrodes S1h-S4h. Although the source electrodes S1h-S4h are isolated in the uppermost layer by the protective film 32 in this manner, these are electrically coupled to each other through the source wiring 30S.

In the surface of the electrodes Gh and S1h-S4h (i.e., above the gate wiring 30G portion and source wiring 30S portion exposed in the bottom of the opening 33), a metal layer 34 is formed by plating or the like. The metal layer 34 is formed from a laminated film including a metal layer 34a formed over the gate wiring 30G and source wiring 30S and a metal layer 34b formed thereover. The lower metal layer 34a contains nickel (Ni), for example, and has the function to suppress or prevent the oxidization of aluminum of mainly the underlying gate wiring 30G and source wiring 30S. Moreover, the upper metal layer 34b contains gold (Au), for example, and has the function to suppress or prevent the oxidization of nickel of mainly the underlying metal layer 34a.

The operating current of the unit transistor cell in such high side transistors QH, QH' is adapted to flow in the thickness direction of the substrate 21 along the side face of the gate electrode 27 (i.e., side face of the groove 25) between the epitaxial layer 21b for the drain and n+-type semiconductor region 24 for the source. That is, a channel is formed along the thickness direction of the semiconductor chip HSCP. As described above, the semiconductor chip HSCP is a semiconductor chip in which a vertical MOSFET (power MOSFET) having a trench gate structure is formed. Here, the vertical MOSFET corresponds to a MOSFET, in which a current between the source and drain flows in the thickness direction of the semiconductor substrate (substrate 21) (in the direction generally perpendicular to the principal surface of the semiconductor substrate).

As described above, the use of the power source device according to Embodiment 3 typically makes it possible to improve the power conversion efficiency at a light load independently of the input power source voltage, as with Embodiment 2. Furthermore, a reduction in various resistances of the semiconductor package makes it possible to further improve the power conversion efficiency.

In the foregoing, although the present invention made by the present inventor has been described specifically based on the embodiments, the present invention is not limited to the above embodiments and various modifications may be made without departing from the scope thereof.

For example, in each of the embodiments described above, the multiphase operation and the operation at a light load have been realized using the peak current control method, however, the present invention is not limited to the peak current control method, and can be similarly applied to the power source device using a current mode control method. That is, as the current mode control method, an average current control method and the like are known other than the peak current control method described above. In the peak current control method, as shown in FIG. 1 etc., the current is monitored typically from the input power source voltage VIN side of the power transistor QH, while in the average current control method, typically the current is monitored via a resistor or the like from the output power source node VO side of the inductor L, or the current is monitored via an averaging circuit or the like from the QH side of the inductor L. As far as the current mode control method is used, a control to maintain the charge quantity approximately constant is possible as described in FIG. 4, and therefore the same effect will be obtained. However, when a reduction in the size of the power source device (i.e., a reduction in the number of external components, external wirings, etc.), the stability in operation during the multiphase operation, and the like are taken into account, the peak current control method is preferably used.

What is claimed is:
1. A power source device comprising:
a first transistor and a second transistor constituting a high side transistor and a low side transistor of a DC/DC converter, respectively, and supplying power to an external load;

a current detection circuit generating a current detection signal reflecting current flowing through the first transistor;

an error amplifier circuit detecting a power source voltage of the external load, and outputting an error amplifier signal which is a result of amplifying the power source voltage of the external load with reference to a first setting voltage;

a pulse generation circuit outputting a pulse signal every time the power source voltage of the external load decreases to a predetermined voltage;

a reverse-current detection circuit which activates a reverse current detection signal upon detection of current flowing in a direction from the power source voltage of the external load toward the second transistor;

a clock generation circuit generating a clock signal of a fixed frequency;

a mode setting signal;

a selection circuit receiving the pulse signal and the clock signal, outputting the pulse signal when the mode setting signal is in an active state and outputting the clock signal when the mode setting signal is in an inactive state; and a switching control circuit configured to:
  turn on the first transistor and turn off the second transistor in response to the pulse signal or the clock signal from the selection circuit,
  turn off the first transistor and turn on the second transistor when a voltage level of the current detection signal reaches a voltage level of the error amplifier signal, and
  turn off the second transistor when the reverse current detection signal is activated, wherein the reverse-current detection circuit is configured to maintain the reverse current detection signal in an inactive state when the mode setting signal is in an inactive state, and wherein the current detection circuit uses a third transistor, which has a transistor size smaller than that of the first transistor and is current-mirror-connected to the first transistor, to generate the current detection signal.

2. The power source device according to claim 1, wherein the pulse generation circuit is further configured to monitor a voltage level of the error amplifier signal, and output the pulse signal with a predetermined pulse width when this voltage level reaches a second setting voltage.

3. A semiconductor device comprising:
a first transistor, when supplied with a power source voltage and controlled to an ON state, supplying energy to an inductor, one end of which is externally coupled to an output power source node;

a second transistor, when supplied with a ground power source voltage and controlled to an ON state, forming a current path of return current from the inductor;

a current detection circuit generating a current detection signal reflecting current flowing through the inductor;

a reverse-current detection circuit which activates a reverse current detection signal upon detection of current flowing in a direction from the output power source node into the second transistor through the inductor;

a first input node receiving a pulse signal every time an output voltage of the output power source node decreases to a predetermined voltage;

a second input node receiving an error amplifier signal, which is a signal obtained by amplifying an output voltage of the output power source node with reference to a predetermined voltage; and a switching control circuit configured to:
  turn on the first transistor and turn off the second transistor in response to the pulse signal from the first input node,
  turn off the first transistor and turn on the second transistor when a voltage level of the current detection signal reaches a voltage level of the error amplifier signal input from the second input node, and
  turn off the second transistor when the reverse current detection signal is activated, wherein the current detection circuit uses a third transistor, which has a transistor size smaller than that of the first transistor and is current-mirror-connected to the first transistor, to generate the current detection signal.

4. The semiconductor device according to claim 3, wherein the first and second transistors, the current detection circuit, the reverse-current detection circuit, and the switching control circuit are mounted together in one semiconductor package, and wherein both the first and second input nodes are external terminals.

5. A power source device comprising:
a first drive unit; a second drive unit; and a common control unit, wherein the first drive unit includes:
  a first high side transistor and a first low side transistor constituting a high side transistor and a low side transistor of a first DC/DC converter, respectively, and supplying power to an external load;
  a first current detection circuit generating a first current detection signal reflecting current flowing through the first high side transistor;
  a first reverse-current detection circuit which activates a first reverse current detection signal upon detection of current flowing in a direction from the power source voltage of the external load toward the first low side transistor; and
  a first switching control circuit turning on/off the first high side transistor and the first low side transistor, wherein the second drive unit includes:
  a second high side transistor and a second low side transistor constituting a high side transistor and a low side transistor of a second DC/DC converter, respectively, and supplying a power to the external load;
  a second current detection circuit generating a second current detection signal reflecting current flowing through the second high side transistor; and
  a second switching control circuit turning on/off the second high side transistor and the second low side transistor, wherein the common control unit includes:
  an error amplifier circuit detecting a power source voltage of the external load, and outputting an error amplifier signal which is a result of amplifying the power source voltage of the external load with reference to a first setting voltage;
  a pulse generation circuit outputting a pulse signal every time the power source voltage of the external load decreases to a predetermined voltage;
  a clock generation circuit generating a first and a second clock signal having the same frequency and different phases, respectively; and
  a selection circuit receiving a mode setting signal, and the pulse signal and the first clock signal, outputting the pulse signal when the mode setting signal is in an active state and outputting the first clock signal when the mode setting signal is in an inactive state, wherein the first reverse-current detection circuit maintains the first reverse current detection signal in an inactive state when the mode setting signal is in an inactive state, wherein the first switching control circuit is configured to:
turn on the first high side transistor and turn off the first low side transistor in response to the pulse signal or the first clock signal from the selection circuit,
turn off the first high side transistor and turn on the first low side transistor when a voltage level of the first current detection signal reaches a voltage level of the error amplifier signal, and
turn off the first low side transistor when the first reverse current detection signal is activated, and wherein the second switching control circuit is configured to:
turns on the second high side transistor and turns off the second low side transistor in response to the second clock signal when the mode setting signal is in an inactive state, and
turn off the second high side transistor and turn on the second low side transistor when a voltage level of the second current detection signal reaches a voltage level of the error amplifier signal.

6. The power source device according to claim 5,
wherein the first current detection circuit uses a third transistor, which has a transistor size smaller than that of the first high side transistor and is current-mirror-connected to the first high side transistor, to generate the first current detection signal, and
wherein the second current detection circuit uses a fourth transistor, which has a transistor size smaller than that of the second low side transistor and is current-mirror-connected to the second low side transistor, to generate the second current detection signal.

7. The power source device according to claim 6,
wherein the pulse generation circuit further monitors a voltage level of the error amplifier signal, and outputs the pulse signal with a predetermined pulse width when this voltage level reaches a second setting voltage.

8. The power source device according to claim 6,
wherein the first drive unit, the second drive unit, and the common control unit are mounted in separate semiconductor packages, respectively.

9. The power source device according to claim 8,
wherein the common control unit further includes:
an overvoltage detection circuit activating an overvoltage detection signal when a power source voltage of the external load is higher than a third setting voltage; and
a signal conversion circuit receiving the overvoltage detection signal and the mode setting signal, and outputting any one of tristate information including a first logic level, a second logic level, and a high impedance level, as a first control signal,
wherein the first drive unit further includes
a discrimination circuit receiving the first control signal and discriminating any one of the tristate information in the first control signal,
wherein the tristate information in the first control signal is assigned to a case where the overvoltage detection signal is in an active state, a case wherein the overvoltage detection signal is in an inactive state and the mode setting signal is in an active states, and a case where the overvoltage detection signal is in an inactive state and the mode setting signal is in an inactive state, respectively.

10. The power source device according to claim 8,
wherein the second drive unit further includes a first circuit which detects a case where the second clock signal is in a high impedance state, and fixes both the second high side transistor and the second low side transistor to an OFF state, and
wherein the common control unit further sets the second clock signal to a high impedance state when the mode setting signal is in an active state.

* * * * *